(12) United States Patent
Ishii et al.

(10) Patent No.: US 7,868,997 B2
(45) Date of Patent: Jan. 11, 2011

(54) PROJECTION OPTICAL SYSTEM INSPECTING METHOD AND INSPECTION APPARATUS, AND A PROJECTION OPTICAL SYSTEM MANUFACTURING METHOD

(75) Inventors: Mikihiko Ishii, Konosu (JP); Yutaka Ichihara, Yokohama (JP); Takashi Gemma, Tokyo (JP)

(73) Assignee: Nikon Corporation, Tokyo (JP)

( * ) Notice: Subject to any disclaimer, the term of this patent is extended or adjusted under 35 U.S.C. 154(b) by 320 days.

(21) Appl. No.: 11/335,461

(22) Filed: Jan. 20, 2006

(65) Prior Publication Data
US 2006/0176457 A1    Aug. 10, 2006

Related U.S. Application Data

(63) Continuation of application No. PCT/JP2004/010863, filed on Jul. 23, 2004.

(30) Foreign Application Priority Data
Jul. 25, 2003   (JP)   ............... 2003-279929

(51) Int. Cl.
G03B 27/42   (2006.01)
G03B 27/54   (2006.01)
(52) U.S. Cl. .......................... 355/53; 355/67
(58) Field of Classification Search ................ 355/52, 355/53, 55, 67; 356/399–401, 515
See application file for complete search history.

(56) References Cited

U.S. PATENT DOCUMENTS 4,346,164 A   8/1982   Tabarelli et al.
4,480,910 A * 11/1984   Takanashi et al. ............. 355/30
5,610,683 A   3/1997   Takahashi
5,715,039 A   2/1998   Fukada et al.
5,825,043 A   10/1998   Suwa (Continued)

FOREIGN PATENT DOCUMENTS

DE      221 563 A1   4/1985

(Continued)

OTHER PUBLICATIONS

B. J. Lin, "Semiconductor Foundry, Lithography, and Partners;" Proceedings of SPIE vol. 4688, 2002, pp. 11-24.

(Continued)

*Primary Examiner*—Hung Henry Nguyen
(74) *Attorney, Agent, or Firm*—Oliff & Berridge, PLC

(57) ABSTRACT

In the inspection apparatus of this projection optical system, a folding glass member, comprising a flat surface part and a reflecting spherical surface part opposing to the flat surface part, is disposed on the image plane side of the projection optical system so that the flat surface part opposes to the projection optical system. Further, in a state wherein a liquid is supplied between the projection optical system and the folding glass member, a measuring beam emitted from an interferometer unit enters the projection optical system; the measuring beam that transmitted through the projection optical system and the liquid, and entered the folding glass member is reflected by the reflecting spherical surface part, and once again passes through the liquid and the projection optical system; and the interference fringes obtained from the measuring beam and the reference beam generated within the interferometer unit are detected.

16 Claims, 10 Drawing Sheets

U.S. PATENT DOCUMENTS

| | | | |
|---|---|---|---|
| 6,650,399 B2 | 11/2003 | Baselmans et al. | |
| 6,785,006 B2 * | 8/2004 | Nishida | 356/515 |
| 6,961,115 B2 | 11/2005 | Hamatani et al. | |
| 7,213,963 B2 | 5/2007 | Lof et al. | |
| 7,227,616 B2 | 6/2007 | Graeupner | |
| 7,301,607 B2 | 11/2007 | Hazelton et al. | |
| 7,486,380 B2 | 2/2009 | Hazelton et al. | |
| 2002/0101574 A1 | 8/2002 | Tsuji | |
| 2002/0118370 A1 | 8/2002 | Nishida | |
| 2002/0159040 A1 | 10/2002 | Hamatani et al. | |
| 2002/0163629 A1 | 11/2002 | Switkes et al. | |
| 2002/0167642 A1 | 11/2002 | Jones et al. | |
| 2003/0030916 A1 | 2/2003 | Suenaga | |
| 2003/0174408 A1 | 9/2003 | Rostalski et al. | |
| 2004/0000627 A1 | 1/2004 | Schuster | |
| 2004/0075895 A1 | 4/2004 | Lin | |
| 2004/0109237 A1 | 6/2004 | Epple et al. | |
| 2004/0114117 A1 | 6/2004 | Bleeker | |
| 2004/0118184 A1 | 6/2004 | Violette | |
| 2004/0119954 A1 | 6/2004 | Kawashima et al. | |
| 2004/0125351 A1 | 7/2004 | Krautschik | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0169834 A1 | 9/2004 | Richter et al. | |
| 2004/0169924 A1 | 9/2004 | Flagello et al. | |
| 2004/0180294 A1 | 9/2004 | Baba-Ali et al. | |
| 2004/0180299 A1 | 9/2004 | Rolland et al. | |
| 2004/0207824 A1 | 10/2004 | Lof et al. | |
| 2004/0211920 A1 | 10/2004 | Maria Derksen et al. | |
| 2004/0224265 A1 | 11/2004 | Endo et al. | |
| 2004/0224525 A1 | 11/2004 | Endo et al. | |
| 2004/0227923 A1 | 11/2004 | Flagello et al. | |
| 2004/0233405 A1 | 11/2004 | Kato et al. | |
| 2004/0253547 A1 | 12/2004 | Endo et al. | |
| 2004/0253548 A1 | 12/2004 | Endo et al. | |
| 2004/0257544 A1 | 12/2004 | Vogel et al. | |
| 2004/0259008 A1 | 12/2004 | Endo et al. | |
| 2004/0259040 A1 | 12/2004 | Endo et al. | |
| 2004/0263808 A1 | 12/2004 | Sewell | |
| 2004/0263809 A1 | 12/2004 | Nakano | |
| 2005/0002004 A1 | 1/2005 | Kolesnychenko et al. | |
| 2005/0007569 A1 | 1/2005 | Streefkerk et al. | |
| 2005/0007570 A1 | 1/2005 | Streefkerk et al. | |
| 2005/0018155 A1 | 1/2005 | Cox et al. | |
| 2005/0018156 A1 | 1/2005 | Mulkens et al. | |
| 2005/0024609 A1 | 2/2005 | De Smit et al. | |
| 2005/0030497 A1 | 2/2005 | Nakamura | |
| 2005/0030498 A1 | 2/2005 | Mulkens | |
| 2005/0030506 A1 | 2/2005 | Schuster | |
| 2005/0036121 A1 | 2/2005 | Hoogendam et al. | |
| 2005/0036183 A1 | 2/2005 | Yeo et al. | |
| 2005/0036184 A1 | 2/2005 | Yeo et al. | |
| 2005/0036213 A1 | 2/2005 | Mann et al. | |
| 2005/0037269 A1 | 2/2005 | Levinson | |
| 2005/0041225 A1 | 2/2005 | Sengers et al. | |
| 2005/0042554 A1 | 2/2005 | Dierichs et al. | |
| 2005/0046813 A1 | 3/2005 | Streefkerk et al. | |
| 2005/0046934 A1 | 3/2005 | Ho et al. | |
| 2005/0048223 A1 | 3/2005 | Pawloski et al. | |
| 2005/0068639 A1 | 3/2005 | Pierrat et al. | |
| 2005/0073670 A1 | 4/2005 | Carroll | |
| 2005/0084794 A1 | 4/2005 | Meagley et al. | |
| 2005/0094116 A1 | 5/2005 | Flagello et al. | |
| 2005/0099635 A1 * | 5/2005 | Kakuchi et al. | 356/515 |
| 2005/0100745 A1 | 5/2005 | Lin et al. | |
| 2005/0110973 A1 | 5/2005 | Streefkerk et al. | |
| 2005/0117224 A1 | 6/2005 | Shafer et al. | |
| 2005/0122497 A1 | 6/2005 | Lyons et al. | |
| 2005/0132914 A1 | 6/2005 | Mulkens et al. | |
| 2005/0134815 A1 | 6/2005 | Van Santen et al. | |
| 2005/0134817 A1 | 6/2005 | Nakamura | |
| 2005/0141098 A1 | 6/2005 | Schuster | |
| 2005/0145265 A1 | 7/2005 | Ravkin et al. | |
| 2005/0145803 A1 | 7/2005 | Hakey et al. | |
| 2005/0146694 A1 | 7/2005 | Tokita | |
| 2005/0146695 A1 | 7/2005 | Kawakami | |
| 2005/0147920 A1 | 7/2005 | Lin et al. | |
| 2005/0153424 A1 | 7/2005 | Coon | |
| 2005/0158673 A1 | 7/2005 | Hakey et al. | |
| 2005/0164502 A1 | 7/2005 | Deng et al. | |
| 2005/0174549 A1 | 8/2005 | Duineveld et al. | |
| 2005/0175940 A1 | 8/2005 | Dierichs | |
| 2005/0185269 A1 | 8/2005 | Epple et al. | |
| 2005/0190435 A1 | 9/2005 | Shafer et al. | |
| 2005/0190455 A1 | 9/2005 | Rostalski et al. | |
| 2005/0205108 A1 | 9/2005 | Chang et al. | |
| 2005/0213061 A1 | 9/2005 | Hakey et al. | |
| 2005/0213072 A1 | 9/2005 | Schenker et al. | |
| 2005/0217135 A1 | 10/2005 | O'Donnell et al. | |
| 2005/0217137 A1 | 10/2005 | Smith et al. | |
| 2005/0217703 A1 | 10/2005 | O'Donnell | |
| 2005/0219481 A1 | 10/2005 | Cox et al. | |
| 2005/0219482 A1 | 10/2005 | Baselmans et al. | |
| 2005/0219499 A1 | 10/2005 | Maria Zaal et al. | |
| 2005/0225737 A1 | 10/2005 | Weissenrieder et al. | |
| 2005/0231694 A1 | 10/2005 | Kolesnychenko et al. | |
| 2005/0237501 A1 | 10/2005 | Furukawa et al. | |
| 2005/0243292 A1 | 11/2005 | Baselmans et al. | |
| 2005/0245005 A1 | 11/2005 | Benson | |
| 2005/0253090 A1 | 11/2005 | Gau et al. | |
| 2005/0259232 A1 | 11/2005 | Streefkerk et al. | |
| 2005/0259233 A1 | 11/2005 | Streefkerk et al. | |
| 2005/0264778 A1 | 12/2005 | Lof et al. | |
| 2005/0270505 A1 | 12/2005 | Smith | |
| 2006/0007418 A1 | 1/2006 | Hamatani et al. | |
| 2006/0103832 A1 | 5/2006 | Hazelton et al. | |
| 2006/0170891 A1 | 8/2006 | Nishinaga et al. | |
| 2006/0285100 A1 * | 12/2006 | Hamatani et al. | 355/55 |
| 2007/0132979 A1 | 6/2007 | Lof et al. | |
| 2009/0109418 A1 | 4/2009 | Hazelton et al. | |

FOREIGN PATENT DOCUMENTS

| | | | |
|---|---|---|---|
| DE | 224 448 A1 | | 7/1985 |
| EP | 1 079 223 A1 | | 2/2001 |
| JP | A 57-153433 | | 9/1982 |
| JP | A-57-153433 | | 9/1982 |
| JP | A-58-202448 | | 11/1983 |
| JP | A-59-19912 | | 2/1984 |
| JP | A-59-019912 | | 2/1984 |
| JP | A-62-65326 | | 3/1987 |
| JP | A-62-065326 | | 3/1987 |
| JP | A-63-157419 | | 6/1988 |
| JP | A-4-305915 | | 10/1992 |
| JP | A-04-305915 | | 10/1992 |
| JP | A-4-305917 | | 10/1992 |
| JP | A-04-305917 | | 10/1992 |
| JP | A-05-062877 | | 3/1993 |
| JP | A-5-62877 | | 3/1993 |
| JP | A-06-124873 | | 5/1994 |
| JP | A-7-220990 | | 8/1995 |
| JP | A-07-220990 | | 8/1995 |
| JP | A-08-316125 | | 11/1996 |
| JP | A-09-184787 | | 7/1997 |
| JP | A-9-184787 | | 7/1997 |
| JP | A-10-160582 | | 6/1998 |
| JP | A-10-303114 | | 11/1998 |
| JP | A-10-340846 | | 12/1998 |
| JP | A-11-176727 | | 7/1999 |
| JP | 11297615 | * | 10/1999 |
| JP | A-11-297615 | | 10/1999 |
| JP | A-2000-058436 | | 2/2000 |
| JP | A-2000-58436 | | 2/2000 |

| | | |
|---|---|---|
| JP | A-2000-097616 | 4/2000 |
| JP | A-2002-71513 | 3/2002 |
| JP | A-2002-071513 | 3/2002 |
| JP | A-2002-071514 | 3/2002 |
| JP | A-2002-250678 | 9/2002 |
| JP | A-2002-296005 | 10/2002 |
| WO | WO 99/49504 A1 | 9/1999 |
| WO | WO 99/60361 A1 | 11/1999 |
| WO | WO 02/090905 A2 | 11/2002 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/001572 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/010611 A2 | 2/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/050324 A2 | 6/2005 |
| WO | WO 2005/054953 A1 | 6/2005 |
| WO | WO 2005/054955 A2 | 6/2005 |
| WO | WO 2005/059617 A2 | 6/2005 |
| WO | WO 2005/059618 A2 | 6/2005 |
| WO | WO 2005/059645 A2 | 6/2005 |
| WO | WO 2005/059654 A1 | 6/2005 |
| WO | WO 2005/062128 A2 | 7/2005 |
| WO | WO 2005/064400 A2 | 7/2005 |
| WO | WO 2005/064405 A2 | 7/2005 |
| WO | WO 2005/069055 A2 | 7/2005 |
| WO | WO 2005/069078 A1 | 7/2005 |
| WO | WO 2005/069081 A2 | 7/2005 |
| WO | WO 2005/071491 A2 | 8/2005 |
| WO | WO 2005/074606 A2 | 8/2005 |
| WO | WO 2005/076084 A1 | 8/2005 |
| WO | WO 2005/081030 A1 | 9/2005 |
| WO | WO 2005/081067 A1 | 9/2005 |
| WO | WO 2005/098504 A1 | 10/2005 |
| WO | WO 2005/098505 A1 | 10/2005 |
| WO | WO 2005/098506 A1 | 10/2005 |
| WO | WO 2005/106589 A1 | 11/2005 |
| WO | WO 2005/111689 A2 | 11/2005 |
| WO | WO 2005/111722 A2 | 11/2005 |
| WO | WO 2005/119368 A2 | 12/2005 |
| WO | WO 2005/119369 A1 | 12/2005 |

OTHER PUBLICATIONS

M. Switkes et al.; "Resolution Enhancement of 157 nm Lithography by Liquid Immersion;" Proceedings of SPIE vol. 4691, 2002, pp. 459-465.
S. Owa et al.; "Nikon F2 Exposure Tool;" Slides 1-25, $3^{rd}$ 157 nm Symposium, Sep. 4, 2002.
S. Owa; "Immersion Lithography;" Slides 1-24, Immersion Lithography Workshop, Dec. 11, 2002.
S. Owa et al.; "Immersion Lithography; its Potential Performance and Issues;" Proceedings of SPIE vol. 5040, 2003, pp. 724-733.
S. Owa et al.; "Potential Performance and Feasibility of Immersion Lithography;" Slides 1-33, NGL Workshop, Jul. 10, 2003.
S. Owa et al.; "Update on 193 nm Immersion Exposure Tool;" Slides 1-38, Immersion Workshop, Jan. 27, 2004.
S. Owa et al.; "Update on 193 nm Immersion Exposure Tool;" Slides 1-51, Lito Forum, Jan. 28, 2004.
M. Switkes et al.,"Resolution Enhancement of 157nm Lithography by Liquid Immersion," J. Microlith., Microfab., Microsyst., vol. 1 No. 3, Oct. 2004, pp. 1-4.
Mar. 29, 2010 Notice of Allowance in Application No. 11/606,909.
May 19, 2009 Japanese Office Action in Japanese Application No. 2005-512083, with translation.
Nov. 25, 2008 Japanese Office Action in Japanese Application No. 2005-512083, with translation.
Aug. 20, 2007 Supplementary European Search Report in European Application No. 04748072.8.
Nov. 2, 2004 International Search Report in Application No. PCT/JP2004/010863, with translation.
Nov. 2, 2004 Written Opinion in Application No. PCT/JP2004/010863, with translation.
May 6, 2010 Notice of Allowance in Japanese Application No. 2005-512083, with translation.

* cited by examiner

PROJECTION OPTICAL SYSTEM INSPECTING METHOD AND INSPECTION APPARATUS, AND A PROJECTION OPTICAL SYSTEM MANUFACTURING METHOD

CROSS-REFERENCE TO RELATED APPLICATION

This is a Continuation application of International Application No. PCT/JP2004/010863, filed Jul. 23, 2004, which claims priority to Japanese Patent Application No. 2003-279929, filed Jul. 25, 2003. The contents of the aforementioned applications are incorporated herein by reference.

BACKGROUND OF THE INVENTION

1. Field of the Invention

The preset invention relates to a projection optical system inspecting method and inspection apparatus, and a projection optical system manufacturing method, and more particularly relates to a projection optical system method and inspection apparatus, and a projection optical system manufacturing method, wherein the projection optical system is provided with an exposure apparatus, used in a lithographic process, that projects an image of a pattern formed on a mask onto a substrate.

2. Description of Related Art

In the fabrication of microdevices, such as semiconductor devices, imaging devices, liquid crystal devices, and thin film magnetic heads, an exposure apparatus is used that transfers the image of a pattern formed on a mask or reticle (hereinafter, these are generically referred to as masks) onto a wafer, a glass plate, or the like (hereinafter, these are generically referred to as substrates), which is coned with a photosensitive agent such as a photoresist. Exposure apparatuses are broadly classified as: full exposure type projection exposure apparatuses, such as steppers, which are widely used when manufacturing, for example, semiconductor devices, and the like, whereon extremely fine patterns are formed; and scanning exposure type projection exposure apparatuses, such as strand-scan systems, which are widely used when manufacturing, for example, large area liquid crystal devices; furthermore, each of these exposure apparatuses normally comprises a projection optical system for transferring the pattern image of the mask onto the substrate.

Because a microdevice is generally fabricated by the formation of a plurality of patterns in layers, when fabricating a microdevice using an expose apparatus, the pattern image of the mask must be faithfully projected with high resolution onto the substrate in a state where the pattern image of the mask to be projected is accurately aligned with the pattern previously formed on the substrate. Consequently, there is demand for a projection optical system in which aberrations are adequately controlled, and that has an exceptionally superior or optical performance with high resolution. The optical performance of a projection optical system is inspected by generating an ideal spherical wave, and then e.g., by the following procedure. Mainly, the performance of the projection optical system is inspected by splitting the generated ideal spherical wave into a measuring beam and a reference beam, entering only the measuring beam into the projection optical system, reflecting the measuring beam that transmitted rough the projection optical system by a reflecting member having a concave spherical mirror disposed on the image plane side of the projection optical system, interfering the measuring beam that once again transmitted through the projection optical system with the reference beam which did not transmit through the projection optical system, and analyzing the interference fringes thereby obtained. For details on the conventional method of inspecting a projection optical system, please refer to, for example, Japanese Unexamined Patent Application, First Publication No. 2002-296005 and Japanese Unexamined Patent Application, First Publication No. H10-160582.

Incidentally, in recent years there has been a rise in the demand for increasingly finer patterns formed on substrates because, to cite the example of manufacturing semiconductor devices, the increasing fineness of the pawn increase the number of semiconductor devices fabricated from a single substrate. Consequently, the fabrication cost of the semiconductor devices decreases, and the semiconductor devices can be made more compact. Additionally, the increasing fineness allows the operating frequency to be increased, and reduces power consumption. Current CPUs (central processing units) are fabricated with a process rule of approximately 0.1 to 0.2 µm, but in the future will be fabricated with a process rule of less than 0.1 µm.

To form a fine pattern, the wavelength of the illumination light that illuminates the mask during exposure must be shortened, and the numerical aperture (NA) of the projection optical system must be set high. Because shortening the wavelength of the illumination light restricts the glass material that can be used for the lens of the projection optical system, the degrees of freedom in the design of the projection optical system unfortunately decrease, and the cost of the projection optical system itself unfortunately increases. Consequently, in recent years, a liquid immersion type projection optical system has been proposed that raises the resolution by filling a liquid, having a refractive index higher than gas (air or nitrogen gas), between the projection optical system and the substrate, leading to an increasingly strong demand to accurately inspect (measure) the optical performance of this liquid immersion type projection optical system.

The preset invention was made by taking such circumstances into consideration, and has an object to provide a projection optical system inspecting method and inspection apparatus, and a projection optical system manufacturing method, that can easily and accurately inspect the optical performance of a liquid immersion type projection optical system, wherein a liquid is disposed on the image plane side.

SUMMARY OF THE INVENTION

The present invention provides a projection optical system inspect method that inspects the optical performance of a projection optical system used for immersion exposure, wherein a liquid is supplied to an image plane side of the projection optical system; and a measuring beam that passes through the projection optical system and the liquid is photoelectrically detected.

In a projection optical system inspecting method of the present invention, it is preferable that an optical member having a flat surface part formed on one end side and a reflecting spherical surface part opposing to the flat surface part is disposed so that the flat surface part opposes to the projection optical system; the liquid is supplied between the projection optical system and the fiat surface part of the optical member; and the measuring beam that passed through the flat surface part, was reflected by the reflecting spherical surface part, and once again passed through the flat surface part is photoelectrically detected.

According to the present invention, the measuring beam that passes through the projection optical system and the liquid enters the optical member from the flat surface part of the optical member, travels inside the optical member, is reflected by the reflecting spherical surface part, travels inside the optical member in the opposite direction, is emitted from the flat once again passes through the liquid and the projection optical system, and is subsequently photoelectrically detected.

In a protection optical system in inspecting method of the present invention, it is preferable that the reflecting spherical surface part around which a flat part is formed, is disposed on the image plane side of the projection optical system; the liquid is supplied between the flat part and the reflecting spherical sine part, and the projection optical system; and the measuring beam reflected by the reflecting spherical surface part is photoelectrically detected.

According to the present invention, the measuring beam that passes through the projection optical system and the liquid is reflected by the reflecting spherical surface part before the measuring beam condenses, passes through the liquid and the projection optical system once again, and is subsequently photoelectrically detected.

The present invention provides a projection optical system inspection apparatus that inspects the optical performance of the projection optical system used for immersion exposure, comprising: a reflecting spherical surf disposed on an image plane side of the projection optical system; and a photoelectric detector that photoelectrically detects a measuring beam that entered the projection optical system, passed through the liquid supplied to at least one part between the projection optical system and the reflecting spherical surface part, and was reflected by the reflecting spherical surface part.

The present invention provides a projection optical system inspection apparatus that inspects the optical performance of a projection optical system, comprising: a plurality of reflecting spherical surface parts disposed on an image plane side of the projection optical system; and a photoelectric detector that photoelectrically detects a measuring beam reflected by the plurality of reflecting spherical surface parts.

The present invention provides a projection optical system inspection apparatus that inspects the optical performance of the projection optical system used for immersion exposure, comprising: a flat part disposed on an image plane side of the projection optical system; and a photoelectric detector that photoelectrically detects the measuring beam that passes through the liquid, which is disposed between the projection optical system and the flat part, and passes through the projection optical system.

A method of manufacturing a projection optical system of the present invention uses the abovementioned projection optical system inspection apparatus.

According to the present invention, the optical performance of an immersion projection optical system can be accurately inspected because, when inspecting the optical performance of the projection optical system, which is the object to be inspected, a liquid is supplied on the image plane side of the projection optical system, and the measuring beam that passes through the projection optical system and the liquid is photoelectrically detected. In addition, because the inspection is performed in a state wherein liquid is filled between the projection optical system and the flat surface part of the optical member, or between the projection optical system and the flat part and the reflecting spherical surface part, the wavefront of the measuring beam is not disturbed by the convection of the liquid, the liquid absorbs little of the measuring beam, and the optical performance of a liquid immersion type projection optical system can be accurately inspected.

In addition, because the liquid is supplied between the projection optical system and the flat surface part of the optical member, or between the projection optical system and the flat part and the reflecting spherical surface part, the optical member and the reflecting spherical surface part call be moved easily, and the inspection of the projection optical system can be performed easily.

BRIEF EXPLANATION OF DRAWINGS

FIG. 3A is a cross sectional view of the folding glass member, and FIG. 3B is a top oblique view of the folding glass member.

FIG. 4A is a cross sectional view of the reflecting spherical surface part and the holder, and FIG. 4B is a top oblique view of the reflecting spherical surface part and the holder.

FIG. 5A is a cross sectional view of the reflecting spherical surface part and the holder, and FIG. 5B is a top oblique view of the inflecting spherical surface part and the holder.

DESCRIPTION OF THE PREFERRED EMBODIMENTS

The following explains the details of the projection optical system inspecting method and inspection apparatus, and a projection optical system manufacturing method according to the embodiments of the present invention, referencing the drawings.

First Embodiment

Figure 1:
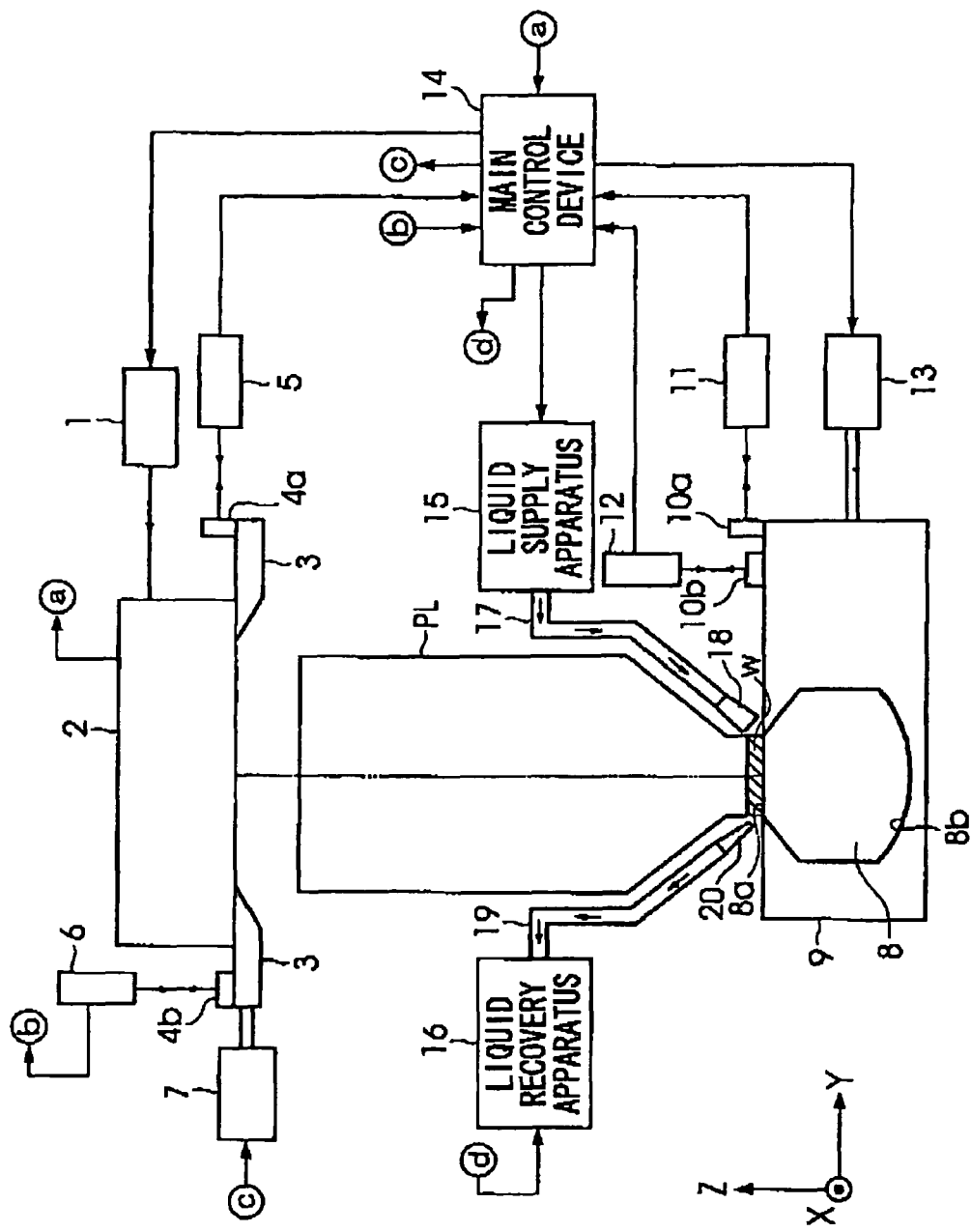
FIG. 1 is a schematic view of the overall constitution of an inspection apparatus according to one embodiment of the present invention.

FIG. 1 is a schematic view of the overall constitution of the inspection apparatus according to one embodiment of the present invention. Furthermore, in the following explanation, the figure is based on an XYZ orthogonal coordinate system, and the explanation of the positional relationships of each member is made referencing this XYZ orthogonal coordinate system. The XYZ orthogonal coordinate system is set so that the Y axis and the Z axis are parallel to the paper surface, and the X axis is in a direction orthogonal to the paper surface. The XYZ coordinate system in the figure is set so that the XY plane is actually parallel to a horizontal plane, and the Z axis is set to the vertically upward direction.

In FIG. 1, reference numeral 1 is a light source that emits a light beam with a cross section having a prescribed shape, e.g. an ArF excimer laser light source (193 nm wavelength). The light beam emitted from the light source 1 is supplied to an interferometer unit 2. The interferometer unit 2 generates a reference beam and a measuring beam from the light beam supplied by the light source 1, supplies the measuring beam to a projection optical system PL, which is the object to be inspected, interferes the reference beam with the measuring beam that passed through the projection optical system PL, and detects the interference fringes of the interface beam obtained. The interferometer unit 2 outputs the interference fringe detection result to a main control device 14. The main control device 14 displays the detection result (the interference fringes themselves) outputted from the interferometer unit 2 on a monitor, which is not shown, or, analyzes the detection result, numerically calculates the wavefront aberration generated in the projection optical system PL, and displays the obtained numerical value on the monitor.

The interferometer unit 2 is held on a stage 3. The stage 3 is constituted movable in the XY plan; and along the Z direction, and is further constituted so that the attitude (the rotation about the X axis, the Y axis, and the Z axis) can be changed. One end of the stage 3 is attached to movable mirrors 4a and 4b, a laser interferometer 5 is provided for a mirror surface of the movable mirror 4a, and a laser interferometer 6 is provided for the movable mirror 4b. Furthermore, although the illustration in FIG. 1 is simplified, the movable mirror 4a comprises a movable minor having a mirror surface perpendicular to the X axis, and a movable mirror having a mirror surface perpendicular to the Y axis.

Additionally, the laser interferometer 5 comprises two Y axis laser interferometers that irradiate the movable mirror 4a with laser light along the Y axis, and an X axis laser interferometer that irradiates the movable mirror 4a with laser light along the X axis; further, one Y axis laser interferometer and one X axis laser interferometer measure the X coordinate and the Y coordinate of the stage 3. In addition, the rotational angle about the Z axis of the stage 3 is measured by the difference in the measurement values of the two Y axis laser interferometers.

Furthermore, the laser interferometer 6 irradiates the movable mirror 4b with laser light, and, by detecting the reflected light thereof, detects both the position in the Z direction and the attitude of the surface of the stage 3. Furthermore, there is only one each of the laser interferometer 6 and the movable mirror 4b shown in FIG. 1, but there are actually three of each provided, which detect the position in the Z direction and the inclination (rotational angles about the X axis and the Y axis) of the stage 3.

The information that indicates the X coordinate, the Y coordinate, and the rotational angle about the Z axis of the stage 3 detected by the laser interferometer 5, and the information that indicates the Z coordinate and the rotational angles about the X axis and the Y axis of the stage 3 detected by the laser interferometer 6, is outputted to the main control device 14. The main control device 14, while monitoring this outputted information, controls the position and attitude of the stage 3 by outputting a control signal to the drive controller 7.

The projection optical system PL, which is the object to be inspected, is disposed in the −Z direction of the interferometer unit 2, and the measuring beam generated by the interferometer unit 2 is supplied to the projection optical system PL. A folding glass member 8 is disposed on the image plane side of the projection optical system PL. The purpose of this folding glass member 8 is to reflect the measuring beam that passed through the projection optical system PL and a liquid w, and guide it to the projection optical system PL again. Additionally, the folding glass member 8 comprises a flat surface part 8a formed on one end side thereof and a reflecting spherical surface part 8b opposing to this flat surface part 8a, and is disposed so that the flat surface part 8a opposes to the projection optical system PL. Furthermore, the folding glass member 8 is positionally controlled so that the flat surface part 8a coincides with the image plane of the projection optical system PL. The folding glass member 8 is made by using a glass material, such a synthetic quartz or fluorite (calcium fluoride, $CaF_2$), and the reflecting spherical surface part 8b is formed, for example, by depositing a metal like chromium (Cr) on a spherical surface formed opposing to the flat surface part 8a.

A stage 9 holds the folding glass member 8. An upper surface of the stage 9 is substantially flush with the flat surface part 8a of the folding glass member 8. The stage 9 is constituted movable in the XY plane and along the Z direction, the same as the stage 3, and is further constituted so that the attitude (rotation about the X axis, the Y and the Z axis) can be changed. Additionally, movable mirrors 10a and 10b are attached to one end of the stage 9 and a laser interferometer 11 is provided facing the mirror surface of the movable mirror 10a, and a laser interferometer 12 is provided for the movable mirror 10b.

Furthermore, although the illusion in FIG. 1 is simplified, the movable minor 10a comprises a movable minor having a mirror ice perpendicular to the X axis, and a movable mirror having a mirror surface perpendicular to the Y axis. In addition, the laser interferometer 11 comprises two Y axis laser interferometers that irradiate the movable minor 10a with laser light along the Y axis, and an X axis laser interferometer that irradiates the movable mirror 10a with laser light along the X axis. Additionally, one Y axis laser interferometer and one X axis laser interferometer measure the X coordinate and the Y coordinate of the stage 9. In addition, the rotational angle about the Z axis of the stage 9 is measured by the difference in the measurement values of the two Y axis laser interferometers.

The laser interferometer 12 irradiates the surface of the movable mirror 10b with laser light, and, by detecting the reflected light thereof, detects the position in the Z direction and the attitude of the stage 9. Furthermore, in FIG. 1, only one each of the laser interferometer 12 and the movable minor 10b are illustrated, but three of each are actually provided, which detect the position in the Z direction and the inclination (rotational angle about the X axis and the Y axis) of the stage 9.

The information detected by the laser interferometer 11 that indicates the X coordinate, the Y coordinate and the rotational angle about the Z axis of the stage 9, and the information detected by the laser interferometer 12 that indicates the Z coordinate and the rotational angles about the X axis and the Y axis of the stage 9, are outputted to the main control device 14. The main control device 14, while monitor this outputted information, controls the position and attitude of the stage 9 by outputting a control signal to a drive controller 13. Such control disposes the folding glass member 8 so that the flat surface part 8a coincides with the image plane of the projection optical system PL. Furthermore, the stage 9 and the drive controller 13 correspond to a first drive apparatus in the present invention.

In addition, in the present embodiment, the projection optical system PL, which is the object to be inspected is a liquid immersion type. Consequently, the liquid w is supplied to the image plane side of the projection optical system PL (between the folding glass member 8 and an optical element L3 (refer to FIG. 2), which is the optical element among the optical elements included in the projection optical system PL that is positioned most on the image plane side).

Furthermore, a spacing of approximately 0.1 mm to several millimeters lies between the folding glass member 8 and the optical element L3, which is the optical element among the optical elements included in the projection optical system PL that is positioned most on the image plane side. The liquid w is, for example, pure water. Pure water is used as the liquid w because it absorbs only a little of the ArF excimer laser light and its refractive index is higher than gas (air or nitrogen gas), enabling an improvement in the numerical aperture of the projection optical system PL.

The inspection apparatus of the present embodiment comprises a liquid supply apparatus 15 and a liquid recovery apparatus 16 in order to supply the liquid w on the image plane side of the projection optical system PL. The purpose of the liquid supply apparatus 15 is to fill the liquid w in at least one part between the projection optical system PL and the folding glass member 8; additionally, the liquid supply apparatus 15 comprises a tank that stores the liquid w, a degasifier, a pressure pump, a temperature regulator capable of adjusting the temperature of the liquid w to an accuracy of ±0.01° C. to ±0.001° C., and the like. One end part of a supply pipe 17 is connected to the liquid supply apparatus 15, and a supply nozzle 18 is connected to the other end part. The liquid w is supplied through the supply pipe 17 and the supply nozzle 18 to the space between the projection optical system PL and the folding glass member 8.

Furthermore, in the present embodiment, the liquid w is adjusted substantially to a temperature of 23° C. and is supplied between the projection optical system PL and the glass member 8. In addition, the pure water (liquid w) supplied from the liquid supply apparatus 15 preferably has a transmittance of 99% mm or greater; in this case, the TOC (total organic carbon), which indicates the total amount of carbon in the organic compounds among the carbon compounds dissolved in the pure water (liquid w), is preferably kept below 3 ppb.

The liquid recovery apparatus 16 comprises a suction pump, the tank that stores the recovered liquid w, and the like. One end part of a recovery pipe 19 is connected to the liquid recovery apparatus 16, and a recovery nozzle 20 is connected to the other end part. The liquid w supplied to be space between the projection optical system PL and the folding glass member 8 is recovered by the liquid recovery apparatus 16 through the recovery nozzle 20 and the recovery pipe 19. The main control device 14 controls the liquid supply apparatus 15 and the liquid recovery apparatus 16.

Namely, when supplying the liquid w to the space between the projection optical system PL and the folding glass member 8, the main control device 14 outputs a control signal to the liquid supply apparatus 15 and the liquid recovery apparatus 16 respectively, and also controls the supply quantity and the recovery quantity of the liquid w per unit of time. Because of this control, just the necessary and sufficient amount of the liquid w is supplied to the space between the projection optical system PL and the folding glass member 8. Furthermore, in the present embodiment, the liquid w between the projection optical system PL and the flat she part 8a of the folding glass member 8 is recovered above from the stage, but a recovery part may be provided at the circumference of the flat surface part 8a of the stage 9, and these may be used in parallel.

Figure 2:
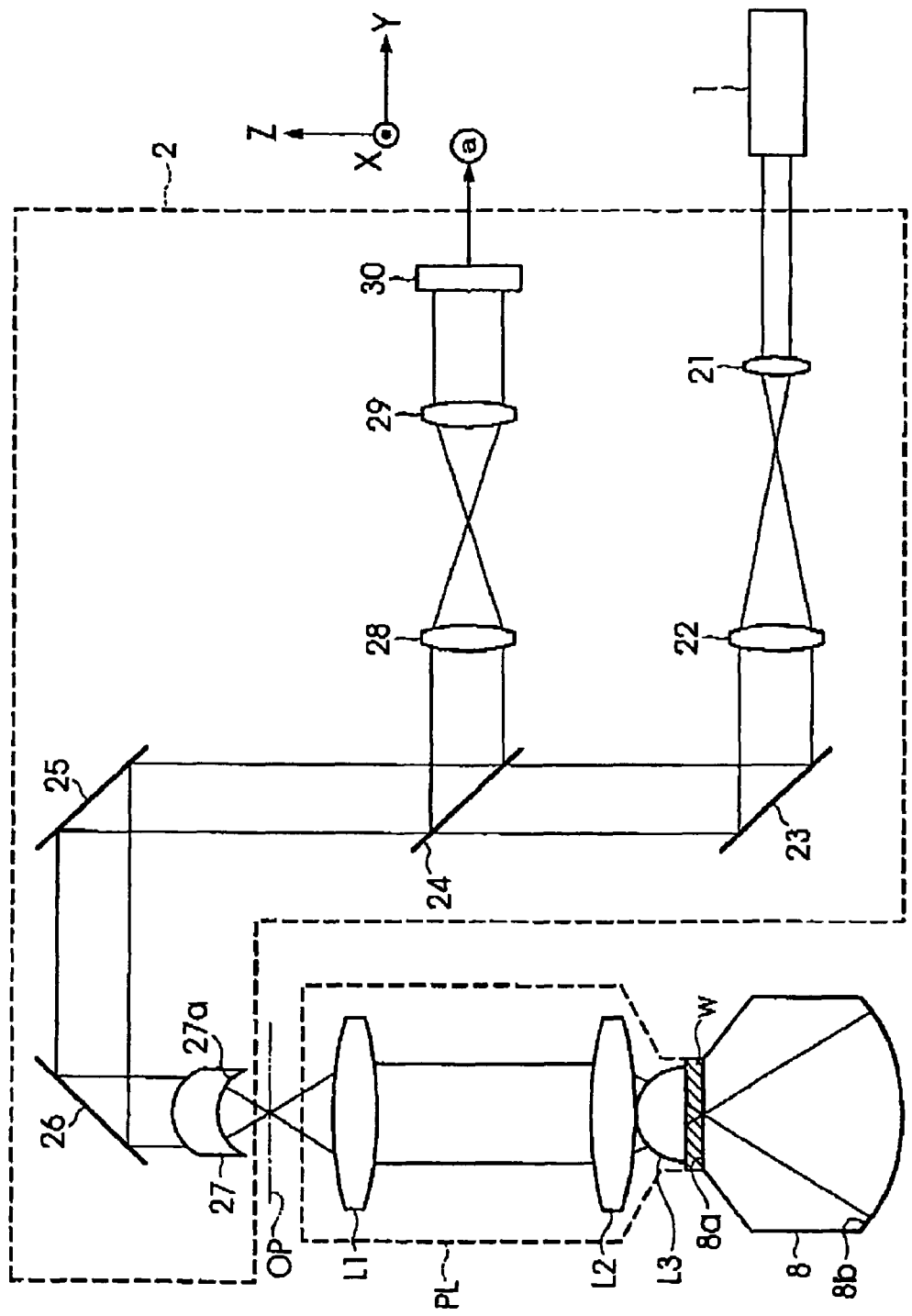
FIG. 2 depicts the constitution on of an interferometer unit provided to the inspection apparatus according to the first embodiment of the present invention.

The above explained an overview of the overall constitution of the inspection apparatus according to the first embodiment of the present invention, and the following explains the constitution of the interferometer unit 2 provided to the inspection apparatus. FIG. 2 depicts the constitution of the interferometer unit 2 provided to the inspection apparatus according to the first embodiment of the present invention. Furthermore, in FIG. 2, members that are identical to members depicted in FIG. 1 are assigned the identical symbol. As depicted in FIG. 2, the interferometer unit 2 comprises a lens 21, a collimator lens 22, a bending mirror 23, a beam splitter 24, bending mirrors 25 and 26, a reference lens 27, relay lenses 28 and 29, and a sensor 30.

The lens 21 condenses the light beam supplied from the light source 1 once, and the collimator lens 22 converts the light beam condensed by the lens 21 to a parallel light beam. The bending mirror 23 deflects in the +Z direction the light beam that passes through the collimator lens 22 and proceeds in the −Y direction. The beam splitter 24 transmits the light beam that is deflected by the bending mirror 23 and proceeding in the +Z direction, and also reflects in the +Y direction the light beam that is proceeding from the bending mirror 25 in the −Z direction. The bending mirror 25 deflects in the −Y direction the light beam that is fitted through the beam splitter 24 and proceeding in the +Z direction, and the bending mirror 26 deflects in the −Z direction the light beam that is deflected by the bending mirror 25 and proceeding in the −Y direction.

The reference lens 27 is a meniscus lens disposed so that it protrudes in the +Z direction and is provided for generating the reference beam and the measuring beam. The surface on the projection optical system PL side of this reference lens 27 is a reference surface 27a, which is set to a spherical surface and the light beam that is deflected by the bending mirror 26 and proceeding in the −Z direction is perpendicularly incident on the reference surface 27a. The light beam that transmitted through the reference surface 27a is used as the measuring beam, and the light beam that was reflected by the reference surface 27a is used as the reference beam. Further, the main control device 14 depicted in FIG. 1, while monitoring the detection result of the laser interferometer 6, controls the position of the stage 3 in the Z direction via the drive controller 7 so that the focal point of the reference lens 27 is disposed at an object plane OP of the projection optical system PL.

The relay lenses 28 and 29 are lenses that relay the light beam that traveled via the bending mirrors 26 and 25, in that order, and was reflected by the beam splitter 24 (the interference beam obtained from the reference beam and the measuring beam). The lens 21, the collimator lens 22, the reference lens 27, and the relay lenses 28 and 29 provided in the interferometer unit 2 are fumed by using a glass material, such as synthetic quartz and fluorite, the same as the optical elements provided to the projection optical system PL.

The sensor 30 detects the interference beam. A photoelectric conversion device, e.g. a two dimensional CCD (charge coupled device), and the like can be used for the sensor 30. Thus, the interferometer unit 2 depicted in FIG. 2 comprises a Fizeau type interferometer. The detection result of the sensor 30 is outputted to the main control device 14 depicted in FIG. 1. Furthermore, for expediency, FIG. 2 depicts an optical element L1, which is disposed on the most object plane side of the optical elements provided in the projection optical system PL, and depicts optical element L2 and L3, which are disposed on the most image plane side; however, from ten to several tens of optical elements are actually provided. The liquid w from the liquid supply apparatus 15 is supplied between the optical element 13 and the folding glass member 8.

The following explains a method of inspection that inspects the optical performance of the projection optical system PL, which is the object to be inspected, using the in on apparatus constituted as explained above, referencing FIG. 1 and FIG. 2. When the inspection starts, the main control device 14 first outputs a control signal to the liquid supply apparatus 15 and the liquid recovery apparatus 16, the liquid w from the liquid supply apparatus 15 is supplied through the supply pipe 17 and the supply nozzle 18 to the space between the projection optical system PL and the folding glass member 8, the liquid w supplied to the space is then recovered by the liquid recovery apparatus 16 through the recovery nozzle 20 and the recovery pipe 19, and a predetermined amount of the liquid w continuously flows so that it fills the space between the projection optical system PL and the folding glass member 8.

Next the main control device 14, while monitoring the detection result of the laser interferometer 5, positions the stage 3 in the XY plane by driving the stage 3 via the drive controller 7 so that the focal point position in the XY plane of the reference lens 27 provided in the interferometer unit 2 is disposed at the first inspection position. Simultaneously, the main control device 14, while monitoring the detection result of the laser interferometer 11, positions the stage 9 to a position corresponding to the position of the stage 3 in the XY plane by moving the stage 9 in the XY plane via the drive controller 13. Thereby, the folding glass member 8 is positioned with respect to the projection optical system PL so that the optical axis that is orthogonal to the flat surface part 8a, which is formed on the folding glass member 8, and that passes through the most bottom of the reflecting spherical surface part 8b, passes through the point optically conjugate with the position of the focal point of the reference lens 27.

Simultaneously, the main control device 14, while monitoring the detection result of the laser interferometers 6 and 12, controls the position in the Z direction and the attitude of each of the stages 3 and 9. At this time, the stage 3 is controlled so that the focal position of the reference lens 27 in the Z direction is included in the object plane OP of the projection optical system PL, and the stage 9 is controlled so that the flat surface part 8a of the folding glass member 8 coincides with the image plane of the projection optical system PL.

When the above process is completed, the main control device 14 out a control signal to the light source 1, which causes to light source 1 to emit light. When the light source 1 emits light, the light beam that proceeds from the light source 1 in the −Y direction is guided to the lens 21 provided to the interferometer unit 2. The light beam guided to the lens 21 passes through the collimator lens 22 and is converted to parallel light, and then enters onto the bending mirror 23 and is deflected in the +Z direction. This light beam that transmits through the beam splitter 24, is deflected in the −Y direction by the bending mirror 25, is further deflected in the −Z direction by the bending mirror 26, and then enters the reference lens 27.

When the light beam enters the reference lens 27, it enters perpendicular to the reference surface 27a of the reference lens 27, part of the light beam is transmitted through, and the remainder is reflected. The light beam that through the reference surface 27a is emitted from the interferometer unit 2 as the measuring beam and condenses at the position of the object plane OP of the projection optical system PL. The condensed measuring beam enters the projection optical system PL while spreading in a spherical wave shape, passes through the optical elements L1 and L2, and the like, enters the optical element L3, and is emitted from the optical element L3 to the image plane side of the projection optical system PL.

The measuring beam emitted from the projection optical system PL transmits through the liquid w, forms an image at the flat surface part 8a of the folding glass member 8, and enters the folding glass member 8 from the flat surface part 8a. The measuring beam that transmitted through the inside of the folding glass member 8 is reflected on the reflecting spherical surface part 8b of the folding glass member 8, proceeds in the reverse direction inside the folding glass member 8, once again passes through the liquid w and the projection optical system PL, and enters the reference lens 27 provided in the interferometer unit 2.

The measuring beam that entered the reference lens 27 and the reference beam generated by the reference surface 27a of the reference lens 27 travel via the bending mirrors 26 and 25, in that order, are reflected by the beam splitter 24, pass through the relay lenses 28 and 29, in that order, and are received by the sensor 30. Because the measuring beam that pass through the projection optical system PL and the reference beam that did not pass through the projection optical system PL enter the sensor 30, the interference beam thereof enters the sensor 30, and the interference fringes, which correspond to the optical performance (the residual aberration, etc.) of the projection optical system PL, are detected. This detection result is outputted to the main control device 14, and the interference fringes themselves are displayed on the monitor (not shown), or the interference fringes are analyzed by the main control device 14 and a numerical value that indicates the wavefront aberration generated in the projection optical system PL is displayed on the monitor.

Subsequently, the main control device 14, while continuing to monitor the detection result of the laser interferometer 5, positions the stage 3 in the XY plane by driving the stage 3 via the drive controller 7 so that the position of the focal point of the reference lens 27 in the XY plane is disposed at the next inspection position. Simultaneously, the main control device 14, while monitoring the detection result of the laser interferometer 11, positions the stage 9 at a position corresponding to the position of the newly positioned stage 3 in the XY plane by moving the stage 9 in the XY plane via the drive controller 13. In this case, the folding glass member 8 is positioned with respect to the projection optical system PL so that the optical axis that is orthogonal to the flat surface part 8a formed on the folding glass member 8, and that passes through the most bottom of the reflecting spherical surface part 8b, passes through the point that is optically conjugate with the position of the focal point of the reference lens 27.

Even if the positions of the stages 3 and 9 in the XY plane have been changed, the main control device 14, while monitoring the detection results of the laser interferometers 6 and 12, controls the position in the Z direction and the attitude of the stages 3 an 9 so that the focal point position of the reference lens 27 in the Z direction is included in the object plane OP of the projection optical system PL, and so that the flat surface part 8a of the folding glass member 8 coincides with the image plane of the projection optical system PL. Furthermore, when the positioning of the stages 3 and 9 is finished, the interference fringes are once again detected, the same as described above, and measurements are likewise subsequently performed at a plurality of locations while changing the positions of the stages 3 and 9 in the XY plane. Through these operations, the optical performance of the projection optical system PL is inspected at a plurality of locations at differing image heights.

According to the first embodiment of the present invention explained above, the liquid w can be supplied between the projection optical system PL and the folding glass member 8 from the liquid supply apparatus 15; consequently, the optical performance of the liquid immersion projection optical system PL can be inspected accurately. In addition, because the optical performance of the projection optical system PL is inspected in a state wherein the folding glass member 8 is disposed on the image plane side of the projection optical system PL and the liquid w is supplied to a small gap of approximately 0.1 to 1.0 mm between the projection optical system PL and the flat surface part 8a formed on the folding glass member 8, it does not require a large amount of the liquid w to fill between the projection optical system PL and the spherical mirror, as in the conventional case wherein a concave spherical mirror is disposed on the image plane side of the projection optical system PL.

In addition, when inspecting the optical performance of the projection optical system PL, because the wavefront of the measuring beam is not disturbed by the convection of the liquid w, and the absorption of the measuring beam by the liquid w is small, it is possible to accurately inspect the optical performance of a liquid immersion type projection optical system. Furthermore, the folding glass member 8 can be easily moved by driving the stage 9 and the projection optical system PL ran be easily inspected because the liquid w is supplied to just a small gap between the projection optical system PL and the flat surface part 8a formed on the folding glass member 8.

Second Embodiment

Figure 3A:
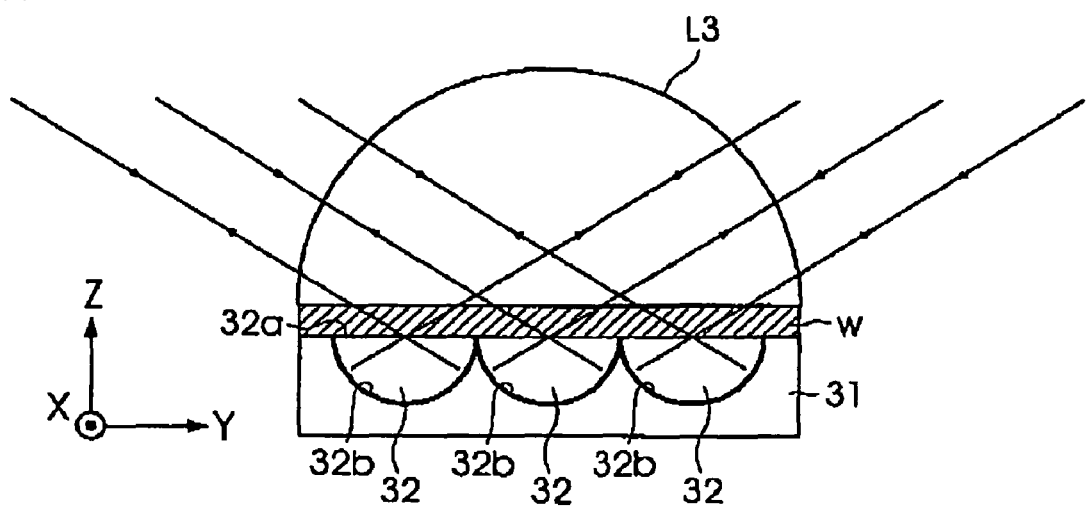
FIG. 3A and FIG. 3B depict the constitution of a folded glass member provided to the inspection apparatus according to the second embodiment of the present invention.
Figure 3B:
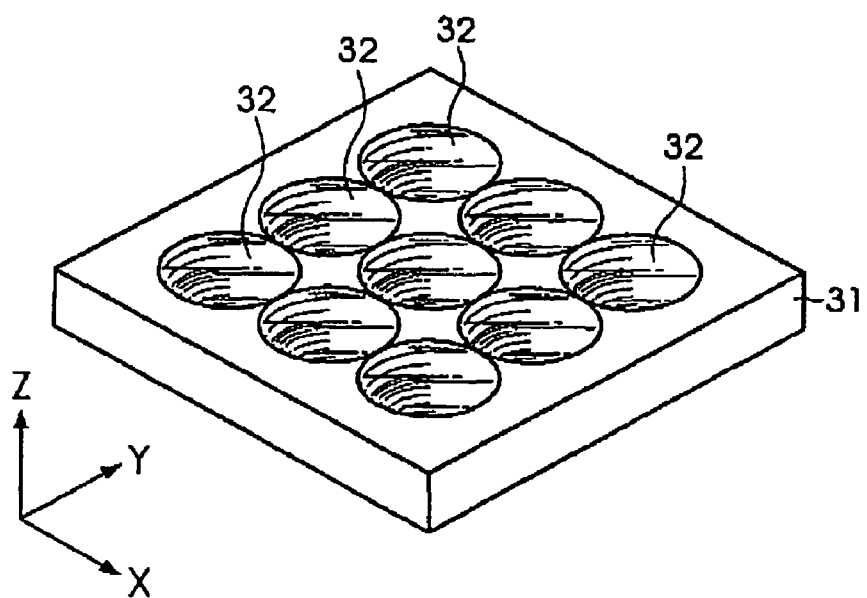

The following explains the second embodiment of the present invention. The inspection apparatus according to the second embodiment of the present invention is constituted substantially the same as the inspection apparatus depicted in FIG. 1, but differs in that, instead of the folding glass member 8, a folding glass member 32 and a holder 31, depicted in FIG. 3, are disposed on the stage 9. FIG. 3A and FIG. 3B depict the constitution of the folding glass member 32 provided in the inspection apparatus according to the second embodiment of the present invention; FIG. 3A is a cross sectional view of the folding glass member 32, and FIG. 3B is a top oblique view of the folding glass member 32.

The folding glass member 32, like the folding glass member 8, reflects the measuring beam that passed through the projection optical system PL and the liquid w, and again guide it to the projection optical system PL. The folding glass member 32 is a semispherical shape and comprises a flat surface part 32a formed on one end side, and a reflecting spherical surface part 32b opposing to the flat sure part 32a; additionally, the flat surface part 32a is disposed so that it opposes to the projection optical system PL. The folding glass member 32 is formed by using a glass material, such as synthetic quartz or fluorite, and the reflecting spherical spice part 32b is formed, for example, by depositing a metal, such as chromium (Cr), on a spherical surface formed opposing to the flat surface part 32a.

A plurality of folding glass members 32 (nine in the example depicted in FIG. 3) are provided, and each reflecting spherical part 32b is held in a state wherein it is fitted to a spherically shaped recessed portion formed on the upper surface of the holder 31 and the folding glass members 32 are arrayed with a prescribed pitch in both the X direction and the Y direction. Each recessed portions formed in the upper surface of the holder 31 is formed corresponding to the image height (inspection) position at which the optical performance of the projection optical system PL is inspected. In addition, as depicted in FIG. 3A, each folding glass member 32 is held by the holder 31 so that its flat surface part 32a coincides with the upper surface of the holder 31, i.e., so that the flat surface part 32a and the upper surface of the holder 31 are included in the same plane. The holder 31 is formed by using, for example, aluminum (Al). In addition, as depicted in FIG. 3A, the folding glass member 32 and the holder 31 are disposed so that their upper surfaces coincide with the image plane of the projection optical system PL.

The following explains the method of inspection that inspects the optical performance of the projection optical system PL, which is the object to be inspected, using the inspection apparatus according to the second embodiment of the present invention as constituted above. When the inspection starts, the liquid w is supplied between the projection optical system PL and the folding glass member 32 along with the holder 31 using the liquid supply 15 and the liquid recovery apparatus 16, the same as in the first embodiment. Next, the main control device 14 positions the stage 9 by moving the stage 9 in the XY plane via the drive controller 13 so that each of the folding glass members 32 is disposed at the prescribed position with respect to the projection optical system PL. At this time, the main control device 14 controls the position in the Z direction and the attitude of the stage 9 so that the flat surface part 32a of each folding glass member 32 coincides with the image plane of the projection optical system PL.

When the above process is completed, the main control device 14, while monitoring the detection result of the laser interferometer 5, positions the stage 3 in the XY plane by driving the stage 3 via the drive controller 7 so that the position of the focal point of the reference leas 27 in the XY plane is disposed at the first inspection position. Simultaneously, the main control device 14, while monitoring the detection result of the laser interferometer 6, controls the position in the Z direction and the attitude of the stage 3, and controls the stage 3 so that the focal point position of the reference lens 27 in the Z direction is contained in the object plane OP of the projection optical system PL.

When the first positioning of the stage 3 is completed, the main control device 14 outputs a control signal to the light source 1, and causes the light source 1 to emit light. The measuring beam and the reference beam are generated in the interferometer unit 2 based on the light beam from this light source 1. Further, the measuring beam emitted from the interferometer unit 2 passes through the projection optical system PL and the liquid w in that order, and enters inside the folding glass member 32 from the flat surface part 32a of any one of the folding glass members 32 positioned on the image plane side of the projection optical system PL (the folding glass member 32 that is disposed at the position corresponding to the first inspection position). This measuring beam is reflected by the reflecting spherical surface part 32b formed in that folding glass member 32, proceeds in the reverse direction inside that folding glass member 32, passes through the liquid w and the projection optical system PL once again, enters the interferometer unit 2, and the interference beam obtained from the measuring beam and the reference beam is detected by the sensor 30 provided to the interferometer unit 2.

When the inspection at the first inspection position is completed, the main control device 14, while monitoring the detection result of the laser interferometer 5, positions the stage 3 in the XY plane by driving the stage 3 via the drive controller 7 so the position of the focal point of the reference lens 27 in the XY plane is disposed at the next inspection position. Simultaneously, the main control device 14, while monitoring the detection result of the laser interferometer 6, controls the stage 3 by controlling the position in the Z direction and the attitude of the stage 3 so that the focal point position of the reference lens 27 in the Z direction is included in the object plane OP of the projection optical system PL.

When the positioning of the stage 3 is completed, based on the light beam from the light source 1, the measuring beam and the reference beam are generated, pass through the projection optical sys PL and the liquid w in that order, and enters the folding glass member 32, the same as the inspection at the first inspection position. At this time, the folding glass member 32 into which the measuring beam enters is the folding glass member 32 disposed at the position corresponding to the current position of the focal point of the reference lens 27 in the XY plane, and differs from the one used when disposed at the first inspection position.

The measuring beam that entered the folding glass member 32 is reflected by the reflecting spherical surface part 32b formed in that folding glass member 32, proceeds in the reverse direction inside that folding glass member 32, transmits through the liquid w and the projection optical system PL once again, enters the interferometer unit 2, and the interference beam obtained firm the measuring beam and of the reference beam is detected by the sensor 30 provided to the interferometer unit 2. Likewise below, inspection is performed sequentially at each inspection position by moving the stage 3 in the XY plane.

According to the inspection apparatus and the method of inspection according to the second embodiment of the present invention as explained above, a plurality of folding glass members 32 are disposed on the image plane side of the projection optical system PL, and the optical performance of the projection optical system PL is inspected at a plurality of locations having differing image heights by changing only the position of the interferometer unit 2, without changing the position of the folding glass members 32. Consequently, in a state wherein the liquid w is supplied to a small gap of approximately several millimeters between the projection optical system PL and the upper surface of the holder 31 and each of the flat surface part 32a formed in the folding glass member 32, the optical performance of the projection optical system PL can be very accurately and easily inspected without moving the stage 9, or, even if moving the stage 9, then moving it by just a small amount.

Furthermore, the abovementioned second embodiment vas explained by citing as an example the case of providing nine folding glass members 32 on the holder 31, but the number of folding glass members 32 is not limited to nine, and may be an arbitrary number. In addition, the array pitch of the folding glass members 32 may also be arbitrary. The number and the array of tee folding glass members 32 are set in accordance with, for example, the number and the array of the inspection positions. Furthermore, FIG. 3 illustrates the case wherein mutually adjacent folding glass members 32 are arrayed so that they make contact, but the folding glass members 32 are not necessarily contactually arrayed. Of course, one folding glass member 32 may be disposed on the holder 31, and the inspection may then be performed while moving the stage 9, the sane as in the first embodiment.

Third Embodiment

Figure 4A:
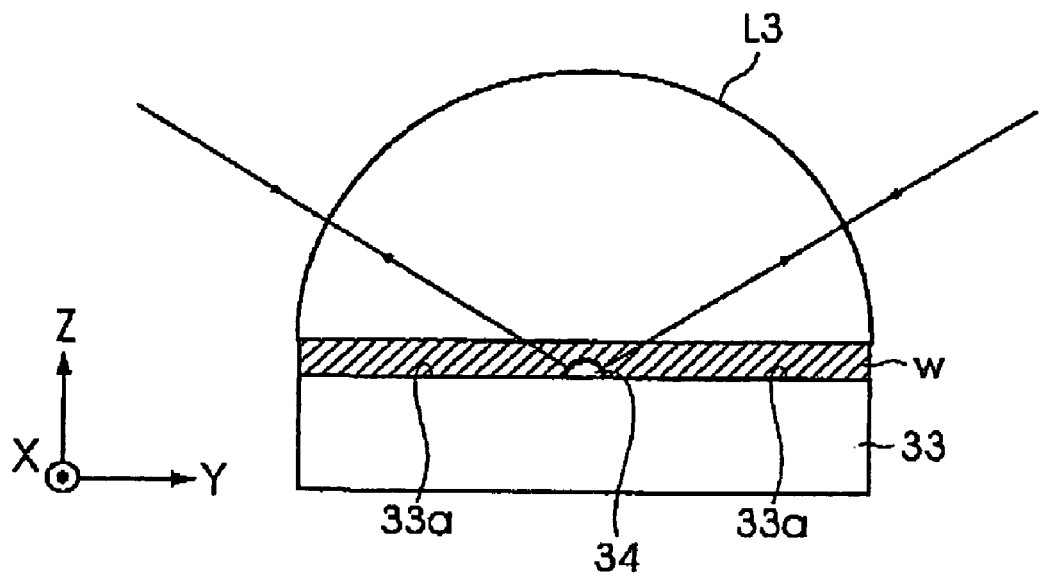
FIG. 4A and FIG. 4B depict the constitution of a reflecting spherical surface part and a holder provided to the inspection apparatus according to the third embodiment of the present invention.
Figure 4B:
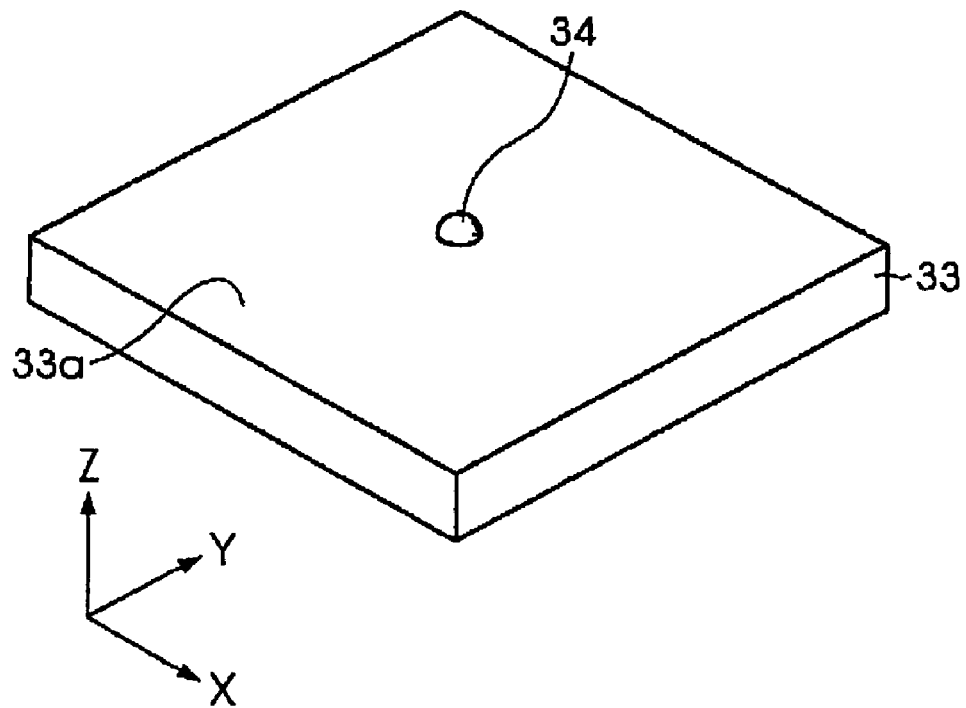

The following explain the third embodiment of the preset invention. The inspection apparatus according to the third embodiment of the present invention is consumed substantially the same as the inspection apparatus depicted in FIG. 1, but differs in that, instead of the folding glass member 8, a holder 33, wherein a reflecting spherical surface part 34 depicted in FIG. 4 is formed, is disposed on the stage 9. FIG. 4A and FIG. 4B depict the constitution reflecting spherical surface part 34 and the holder 33 provided in the inspection apparatus according to the third embodiment of the present invention; FIG. 4A is a cross sectional view of the reflecting spherical surface part 34 and the holder 33, and FIG. 4B is a top oblique view of the reflecting spherical surface part 34 and the holder 33.

The holder 33 comprises a flat shaped plate made of, for example, aluminum (Al), and at substantially the center of a flat part 33a of the upper surface of the holder 33 a reflecting spherical surface part 34 is formed. The purpose of this reflecting spherical surface part 34 is to reflect the measuring beam that passed through the projection optical system PL and the liquid w, and guide it to the projection optical system PL once again; the reflecting spherical surface part 34 is a semispherical shape and is provided in a state protruding from the flat part 33a by approximately 0.1 to 1 mm, as depicted in FIG. 4A and FIG. 4B. The reflecting spherical surface part 34 is formed by vapor depositing a metal, such as chromium (Cr) on the semispherically shaped member, and the flat surface thereof is attached to the holder 33 in a state facing the flat part 33a. In addition, a spherical member, such as a steel ball, is vapor deposited with a metal, such as chromium (Cr), and a semispherically shaped recessed portion, whose diameter is equal to the spherical member, is formed in the holder 33, and the spherical member vapor deposited with metal is attached to the holder 33 by fitting it to the recessed portion. The attachment of this spherical member may use an adhesive or the like, or may be detachable (replaceable) by making the holder 33 from a magnet, or the like. In addition, the spherical member; such as a steel ball, may be coated with silicon (Si) instead of chromium (Cr).

In addition, as depicted in FIG. 4A, the flat part 33a of the holder 33, to which the reflecting spherical surface part 34 is attached, is disposed toward the projection optical system, e.g., the flat part 33a is disposed so that it coincides with the image plane of the projection optical system PL. Thereby, the reflecting spherical surface part 34 forms a protrusion toward the projection optical system PL, and is disposed between the projection optical system PL and the image plane of the projection optical system PL. This arrangement is adopted for the following reason. Namely, a high intensity measuring beam is used when inspecting the optical performance of the projection optical system PL, and the measuring beam is condensed at the position of the image plane of the projection optical system PL, therefore further increasing its intensity.

Accordingly, if the flat surface part 8a of the folding glass member 8 is disposed in the image plane of the projection optical system PL, for example as in the first embodiment, then the intensity of the measuring beam may optically damage the flat surface part 8a of the folding glass member 8, or there is a possibility that the liquid w supplied between the projection optical system PL and the folding glass member 8 will boil and generate bubbles. To prevent this, the reflecting spherical surface part 34 is disposed between the projection optical system PL and the image plane of the projection optical system PL, and optical damage, the generation of bubbles, and the like, is prevented by reflecting the measuring beam on the reflecting spherical surface part 34 before the measuring beam condenses and reaches an intensity that impacts the inspection.

The method of inspection the inspects the optical performance of the projection optical system PL, which is the object to be inspected, using the inspection apparatus according to the third embodiment of the present invention in the above constitution, is performed the same as in the first embodiment. Namely, the main cool device 14 positions the stage 3 in the XY plane, sets the position of the stage 3 (the focal position of the reference lens 27 in the XY plane), and positions the stage 9 in the XY plane so that the reflecting spherical surface part 34 is disposed at a position corresponding to the position of the stage 3 (the position where the measuring beam is projected by the projection optical system PL). Further, the measuring beam that passed through the projection optical system PL and the liquid w, in that order, is reflected by the reflecting spherical surface part 34, and the measuring beam that once again passed trough the liquid w and the projection optical system PL is interfered with the reference beam, and detected by the sensor 30. The above operation is performed repetitively while changing the position of the stages 3 and 9 in the XY plane.

According to the inspection apparatus and the method of inspection according to the third embodiment of the present invention explained above, the reflecting spherical surface part 34 is disposed between the projection optical system PL and the image plane of the projection optical system PL, and the measuring beam is reflected before it condenses. Consequently, it is possible to prevent situations that cause problems with the inspection, such as the intensity of the measuring beam rising because the high intensity measuring beam passes through the projection optical system PL, enters the liquid w, and condenses, which causes the liquid w to boil and generate bubbles.

Fourth Embodiment

Figure 5A:
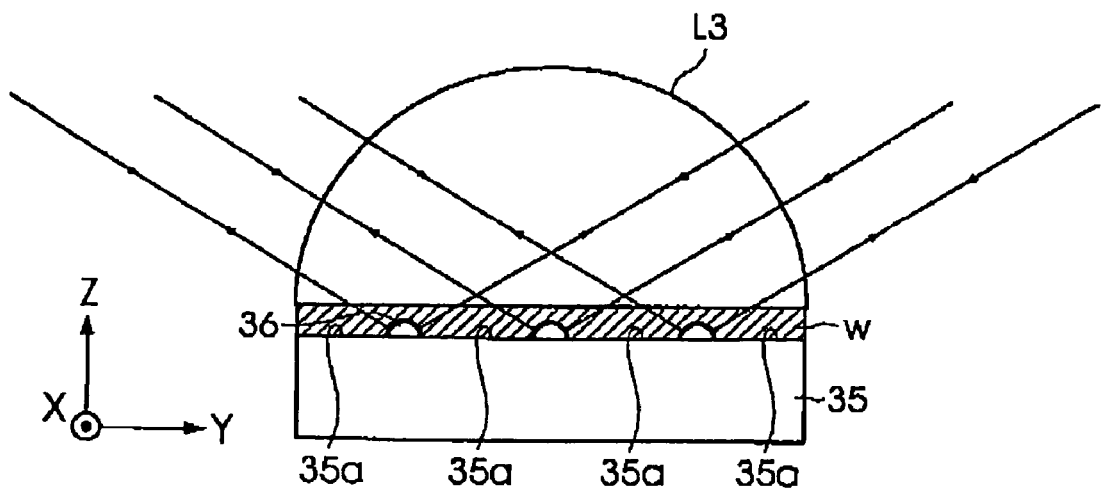
FIG. 5A and FIG. 5B depict the constitution of a reflecting spherical surface part and a holder provided to the inspection apparatus according to the fourth embodiment of the present invention.
Figure 5B:
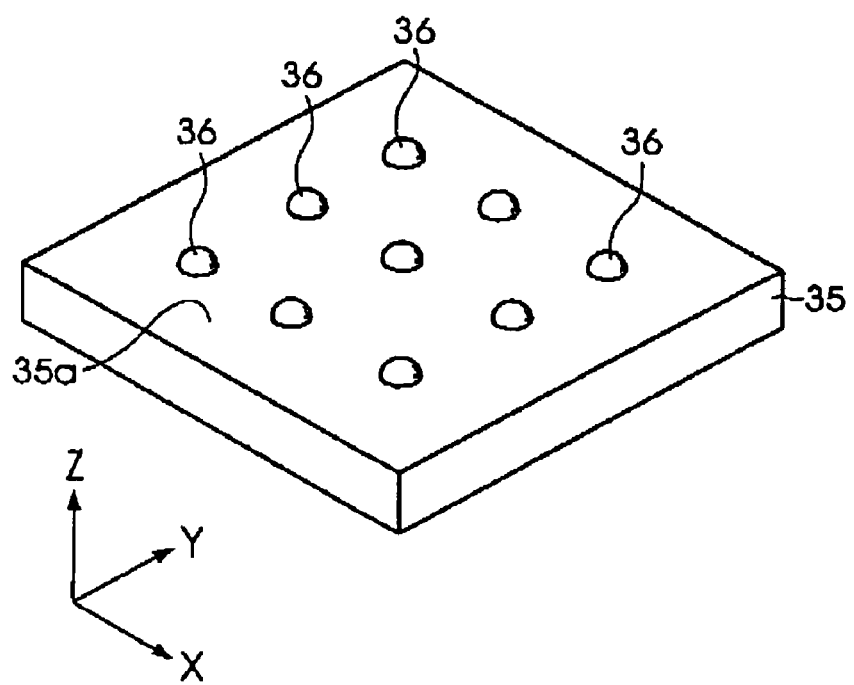

The following explains the fourth embodiment of the present invention. The inspection apparatus according to the fourth embodiment of the present invention is constituted substantially the same as the inspection apparatus depicted in FIG. 3, but differs in that, of the holder 33 provided on the stage 9 and wherein the reflecting spherical surface part 34 is formed, a holder 35 is provided wherein a plurality of reflecting spherical surface parts 36 are formed FIG. 5A and FIG. 5B depict the constitution of the reflecting spherical surface parts 36 and the holder 35 provided in the inspection apparatus according to the fourth embodiment of the present invention; FIG. 5A is a cross sectional view of the reflecting spherical surface parts 36 and the holder 35, and FIG. 5B is a top oblique view of the reflecting spherical surface parts 36 and the holder 35.

The holder 35 is a flat shaped plate made of, for example, aluminum (Al). A plurality of reflecting spherical surface parts 36 are formed on a flat part 35a of the upper surface of the holder 35, and arrayed in both the X direction and the Y direction. These reflecting spherical surface parts 36 are each the same as the reflecting spherical surface part 34 described in the third embodiment; each is formed by vapor depositing a metal, such as chromium (Cr), on a semispherical member or a spherical member, and is semispherically shaped and provided in a state protruding from the flat part 35a by approximately 0.1 to 1 mm, as depicted in FIG. 5A and FIG. 5B. Furthermore, the amount by which the reflecting spherical surface parts 36 protrude from the flat part 35a is set so that it is smaller than the between the optical element L3 and the flat part 35a of the holder 35, as depicted in FIG. 5A.

In addition, as depicted in FIG. 5A, the flat part 35a of the holder 35, whereon the reflecting spherical surface parts 36 are attached, disposed facing the projection optical system, e.g., disposed so that the flat part 35a coincides with the image plane of the projection optical system PL. Thereby, each reflecting spherical surface part 36 forms a protrusion toward the projection optical system PL, and is disposed the projection optical system PL and the image plane of the projection optical system PL in order to prevent the generation of bubbles, and the like, due to the condensed measuring beam.

The method of inspection that ids the optical performance of the projection optical system PL, which is the object to be inspected, is performed using the inspection apparatus according to the fourth embodiment of the preset invention as constituted above, the same as in the second embodiment. Namely, the main control device 14, after positioning the stage 9 at a prescribed position, positions the stage 3 in the XY plane, without moving the stage 9, so that the focal point position of the reference lens 27 is disposed in accordance with the positions at which the reflecting spherical surface parts 36 are formed. Further, the measuring beam that passes through the projection optical system PL and the liquid w, in that order, is reflected by the reflecting spherical surface part 36, and the measuring beam that once again passes through the liquid w and the projection optical system PL is interfered with the reference beam, and detected by the sensor 30. The above operation is performed respectively while changing only the position of the stage 3 in the XY plane.

According to the inspection apparatus and the method of inspection according to the fourth embodiment of the present invention as explained above, a plurality of reflecting spherical surface parts 36 are disposed on the image plane side of the projection optical system PL, and the optical performance of the projection optical system PL is inspected at a plurality of locations at differing image heights by changing just the position of the interferometer unit 2, without changing the positions of the reflecting spherical surface parts 36 and the holder 35. Consequently, in a state wherein the liquid w is supplied to a small gap between the projection optical system PL and the upper surfaces of the reflecting spherical surface parts 36 and the holder 35, the optical performance of the projection optical system PL can be very accurately and easily inspected without moving the stage 9, or, even if moving the stage 9, then moving it by just a small amount. In addition, because each reflecting spherical surface part 36 is disposed between the projection optical system PL and the image plane of the projection optical system PL and the measuring beam is reflected before it condenses, it is possible to prevent the misdetection, and the like, of the optical performance due to thermal fluctuations of the liquid w and/or problems such as the liquid w boiling and generating bubbles.

Fifth Embodiment

Figure 6:
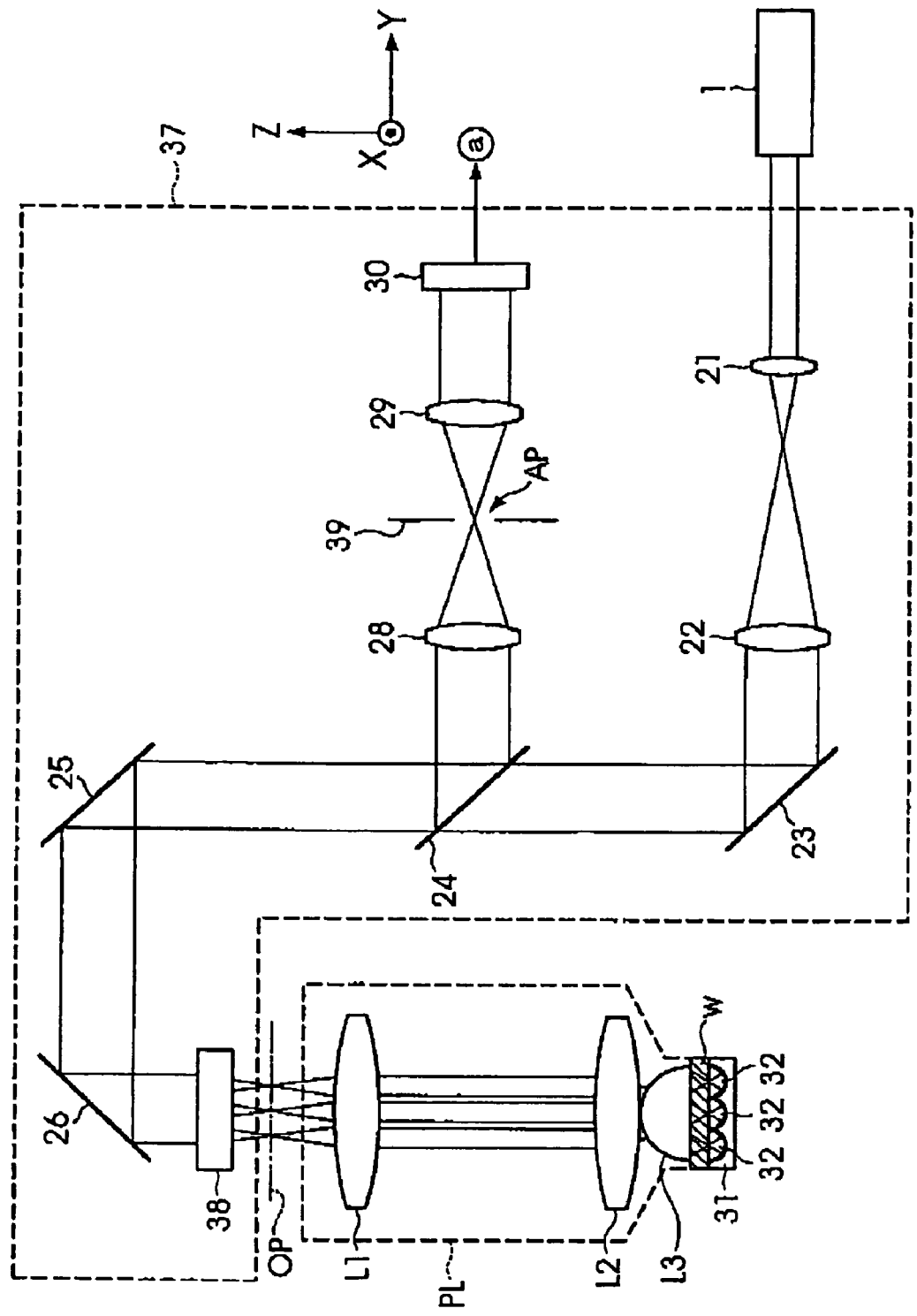
FIG. 6 depicts the constitution of the interferometer unit provided to the inspection apparatus according to the fifth embodiment of the present invention.

The following explains the fifth embodiment of the present invention. The overall constitution of the inspection apparatus according to the fifth embodiment of the present invention is the same as the inspection apparatus according to the second embodiment or the fourth embodiment, but differs in that an interferometer unit 37 is provided instead of the interferometer unit 2. FIG. 6 depicts the constitution of the interferometer unit 37 provided to the inspection apparatus according to the fifth embodiment of the present invention. Furthermore, FIG. 6 illustrates the case wherein the folding glass members 32 and the holder 31 depicted in FIG. 3 are disposed on the image plane side of the projection optical system PL, but the reflecting spherical surface parts 36, the holder 35, and the like, depicted in FIG. 5 can also be disposed on the image plane side of the projection optical system PL.

Figure 7:
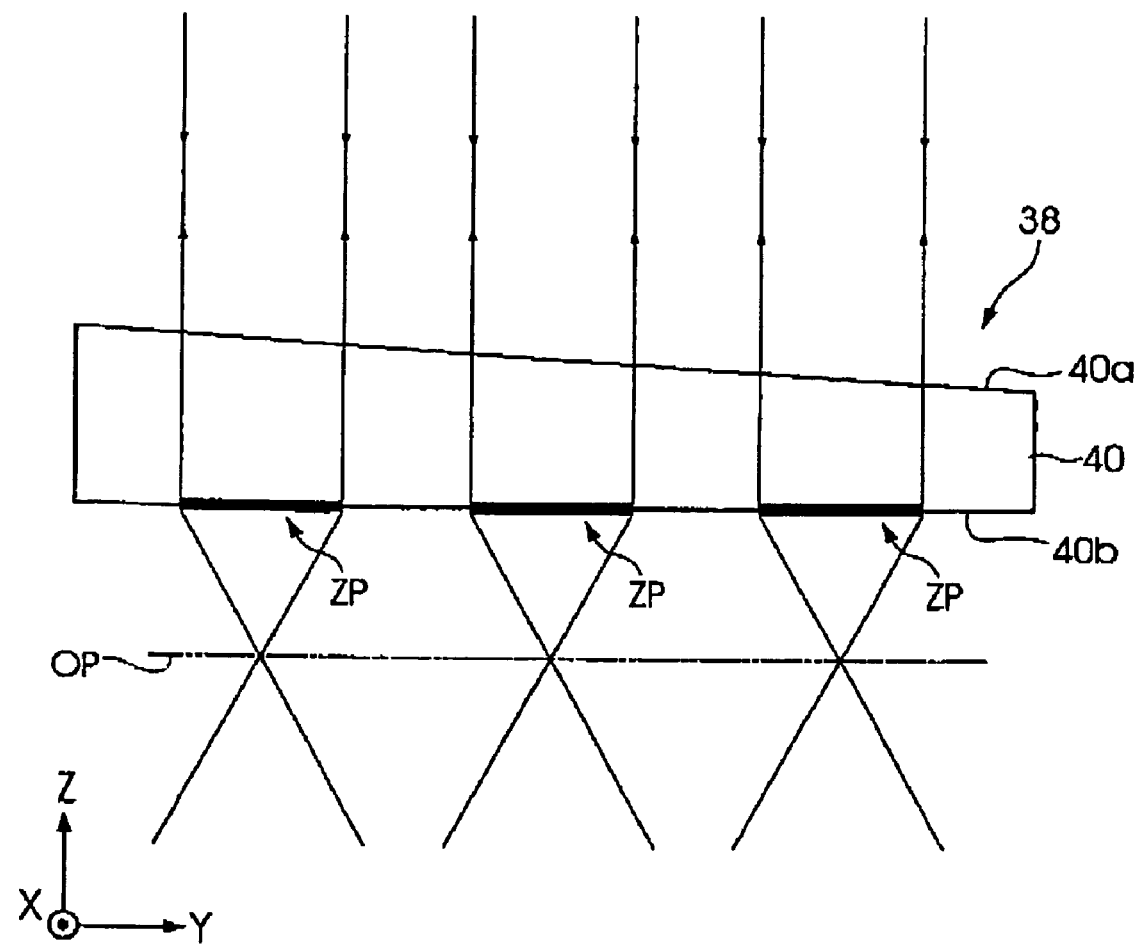
FIG. 7 is a cross sectional view that depicts the constitution of an optical member provided to the inspection apparatus according to the fifth embodiment of the present invention.

The interferometer unit 37 depicted in FIG. 6 differs from the interferometer unit 2 depicted in FIG. 2 in that, instead of the reference lens 27 provided to the interferometer unit 2, the interferometer unit 37 comprises an optical member 38, and a blind mechanism 39 is provided in the optical path between the relay lenses 28 and 29. The optical member 38 generates a plural of measuring beams and a reference beam from the light beam from the light source 1. FIG. 7 is a cross sectional view that depicts the constitution of the optical member 38 provided to the inspection apparatus according to the fifth embodiment of the present invention.

Figure 8:
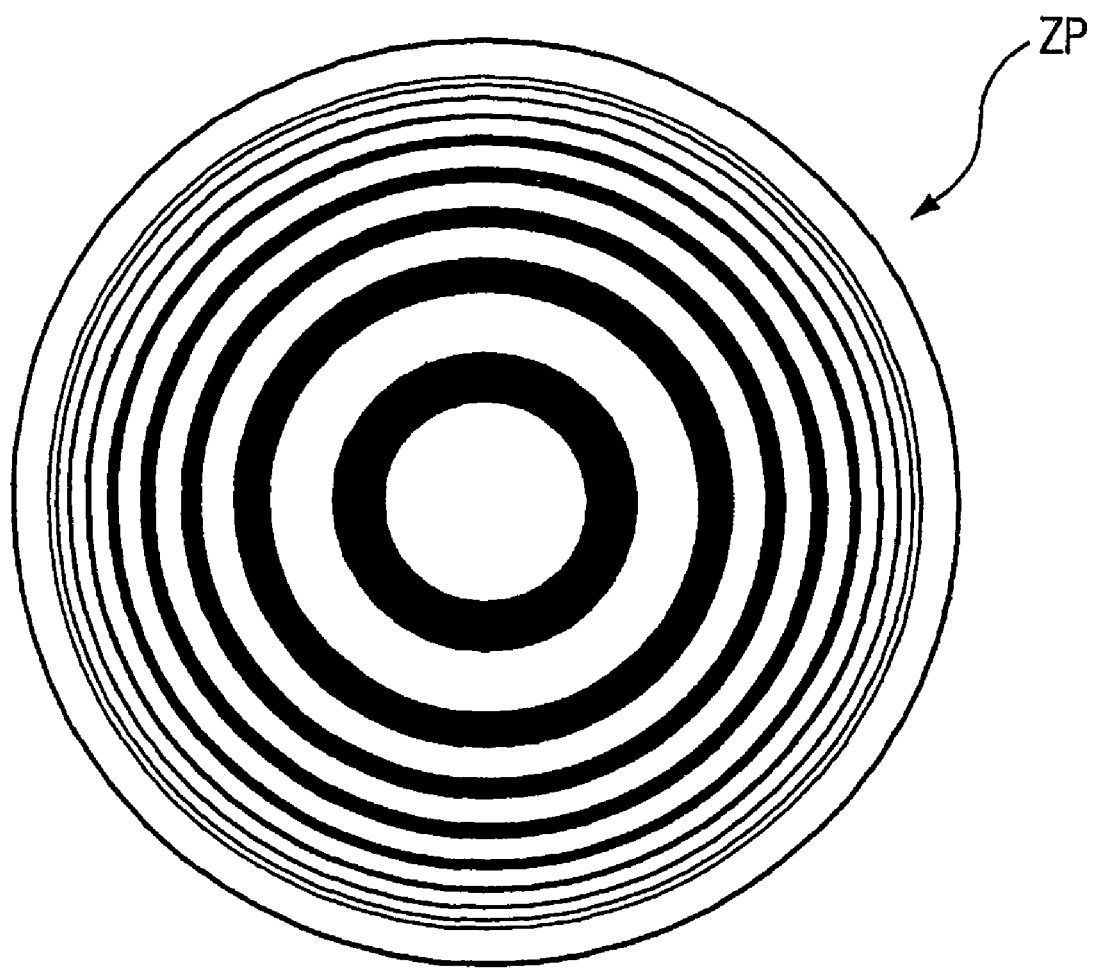
FIG. 8 depicts one example of a zone plate formed in the optical member.

As depicted in FIG. 7, the optical member 38 comprises a wedge shaped substrate member 40 made of, for example, synthetic quartz or fluorite. One surface 40a of this substrate member 40 is disposed so and it is inclined with respect to the incident light beam, and another surface 40b is dispose so that it is orthogonal to the incident light beam (so that it is orthogonal to the object plane OP of the projection optical system PL). A plurality of zone plates ZP is formed on the surface 40b. FIG. 8 depicts one example of a zone plate ZP formed in the optical member 38. As depicted in FIG. 8, the zone plate ZP is a plate wherein a plurality of annular light shielding zones, made of chromium (Cr) or the like, are concentrically formed, the zone plate ZP diffracts and condenses the incident light beam.

Among the light beams which are entered into the substrate member 40 from the −Z direction, a light beam condensed by the zone plates ZP is used as the measuring beam, and the light beam reflected by the shielding bodies formed in the zone plates ZP is used as the reference beam. Here, because a light beam reflected by the zone plates ZP is used as the reference beam, in order to eliminate any impact on the reference beam due to reflections at the surface 40a of the substrate member 40 and multiple reflections inside the substrate member 40, one surface of the substrate member 40 is disposed so that it is inclined with respect to the incident light beam.

The zone plates ZP are formed in the X direction and the Y direction in the surface 40b of the substrate member 40, and its array pitch is set in accordance with the projection magnification of the projection optical system PL and the array pitch of the folding glass members 32 disposed on the image plane side of the projection optical system PL. For example, if the projection magnification of the projection optical system PL is $1/\beta$ (were b is, for example, 4 or 5) and the array pitch of the folding glass members 32 in X direction and the Y direction is $P_1$, then the array pitch $P_2$ of the zone plates ZP in the X direction and the Y direction is expressed by $P_2 = \beta \times P_1$.

The blind mechanism 39 is provided for passing therethrough any one among the plurality of measuring beams and reference beams generated by the optical member 38, and guiding such to the sensor 30. The blind mechanism is disposed in the optical path between the relay lenses 28 and 29 at a position optically conjugate to the surface (the object plane of the projection optical system PL) wherein the focal point of the plurality of measuring beams generated by the optical member 38 is formed, and is constituted so that the size of the aperture AP and the position in the ZX plane where the aperture AP is formed is variable.

Figure 9:
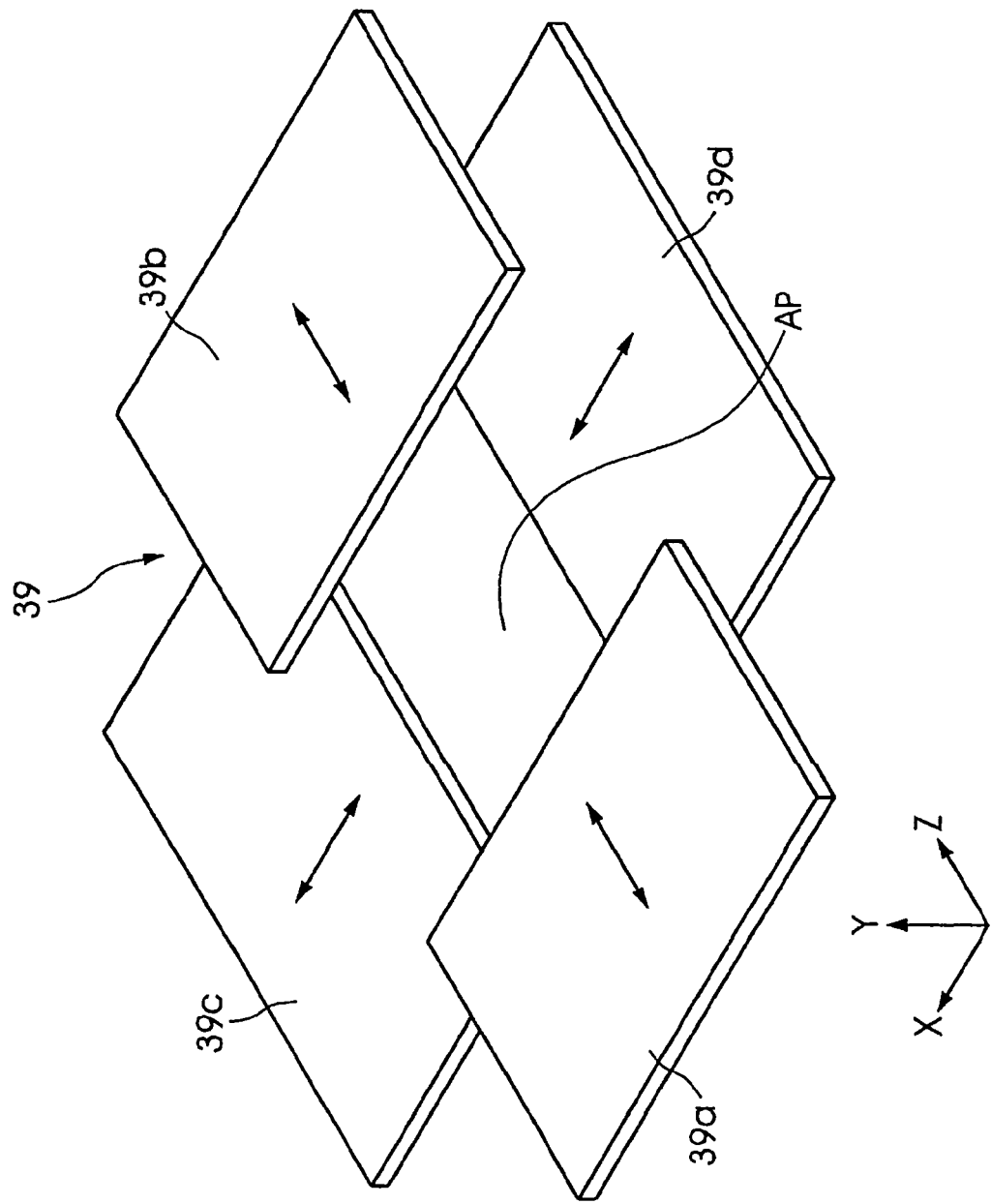
FIG. 9 depicts a schematic view of the constitution of a blind mechanism.

FIG. 9 is a schematic view of the constitution of the blind mechanism 39. As depicted in FIG. 9, the blind mechanism 39 comprises four variable blinds 39a-39d, and their drive mechanism (not shown). The blinds 39a and 39b are constituted movable in the Z direction within the ZX plane, and the blinds 39c and 39d are constituted movable in the X direction within the ZX plane. Accordingly, it is possible to select the measuring beam and the reference beam that pass through the aperture AP by properly setting the position of the blinds 39a and 39b in the Z direction and the position of the blinds 39c and 39d in the X direction, and by varying the size of the aperture AP and the position within the ZX plane where the aperture AP is formed. The main control device 14 controls the blind mechanism 39.

The inspecting method that inspects the optical performance of the projection optical system PL, which is the object to be inspected, using the inspection apparatus according to the fifth embodiment of the present invention as constituted above is performed as follows. First, the main control device 14 outputs a control signal to the liquid supply apparatus 15 and the liquid recovery apparatus 16 to supply the liquid w between the projection optical system PL and the folding glass member 32 and the holder 31 (between the projection optical system PL and the folding glass member 32 and between the projection optical system PL and the holder 31). Next, the main control device 14 positions the stage 9 so that each folding glass member 32 is disposed at the prescribed position with respect to the projection optical system PL by moving the stage 9 in the XY plane via the drive controller 13.

Simultaneously, the main control device 14 positions the stage 3 in the XY plane via the drive controller 7 so that the focal position of each measuring beam generated by the optical member 38 is disposed at a position optically conjugate with the folding glass member 32. At this time, the main control device 14 controls the position in the Z direction and the attitude of the stages 3 and 9 so that the focal position of each measuring beam generated by the optical member 38 is disposed within the object plane OP of the projection optical system PL, and so that the flat surface part 32a of each folding glass member 32 coincides with the image plane of the projection optical system PL.

Next, the main control device 14 controls the blind mechanism 39, and passes through the aperture AP, which is formed by blinds 39a-39d, only one of the plurality of measuring beams and reference beams generated by the optical member 38, and sets the position and size of the aperture AP in the ZX plane so that the other measuring beams and reference beams are shielded by the blinds 39a-39d. When the above process is completed, the main control device 14 output a control signal to the light source 1 and causes the light source 1 to emit light. A plurality of measuring beams and reference beams is generated in the interferometer unit 37 based on the light beam from the light source 1, and the generated plurality of measuring beams pass through the projection optical system PL and the liquid w, in that order, and eater each of the folding glass members 32 positioned on the image plane side of the projection optical system PL.

Each measuring beam is reflected by the reflecting spherical surface part 32b formed in each folding glass member 32, proceeds inside that folding glass member 32 in the reverse direction, passes through the liquid w and the projection optical system PL once again, and enters the interferometer unit 37. Each measuring beam that enters the interferometer unit 37 is reflected by the beam splitter 24 via the bending mirrors 26 and 25, in that order, along with a reference beam generated by the optical member 38, passes through the relay lens 28, and enters the blind mechanism 39. Among the plurality of measuring beams and reference beams that entered the blind mechanism 39, only one measuring beam and one reference beam that entered at the position where the aperture AP is disposed pass through the blind mechanism 39. This measuring beam and this reference beam pass through the relay lens 29 and enter the sensor 30, which detects the interference beam thereof. The detection result of the sensor 30 is outputted to the main control device 14.

Next the main control device 14 controls the blind mechanism 39 so as to change the position of the aperture AP in the ZX plane, a measuring beam and a reference beam are passed through, which are different from the measuring beam and the reference beam that previously passed through, the interference fringes thereof are detected by the sensor 30, and the detection result thereof is outputted to the main control device 14. Likewise below, while the blind mechanism 39 is controlled and the position of the aperture AP in the ZX plane is changed, the interference fringes of a differing measuring beam and reference beam are detected. In so doing, the optical performance of the projection optical system PL is inspected at differing image height positions.

According to the inspection apparatus and the inspect method in accordance with the fifth embodiment of the present invention explained above, the optical performance of the projection optical system PL is inspected by changing the position of the aperture AP of the blind mechanism 39 in the ZX plane, without changing the position of the interferometer unit 37 disposed on the object plane side of the projection optical system PL and the position of the folding glass members 32 disposed on the image plane side of the projection optical system PL. Consequently, there is no need to move the interferometer unit 37 and the folding glass members 32 to inspect the optical performance of the projection optical system PL at differing image height positions, and the optical performance of the projection optical system PL can therefore be inspected easily. The fifth embodiment of the print invention explained above cited the example of a case of inspecting the projection optical system PL by disposing folding glass members 32 on the image plane side of the projection optical system PL, but the optical performance of the projection optical system PL can be inspected with the same inspecting method even if the reflecting spherical surface parts 36 and the holder 35 depicted in FIG. 5 are disposed. In addition, with the fifth embodiment, the optical performance of the projection system PL is inspected at differing image height positions by changing the position of the blind mechanism 39; however, the light from the light source 1 may be selectively used and sequentially impinged upon each zone plate ZP, and all interference beams may be detected by the sensor 30.

In addition, a zone plate ZP is used in the abovementioned embodiments to generate a plurality of measuring beams and reference beams, but a diffraction grating can be used instead. Furthermore, instead of the optical member 38, it is possible to generate the plurality of measuring beams and reference beams by providing small reference lenses (referred to as elements in the present invention) each of which has a function the same as the reference lens 27 depicted in FIG. 2 in the XY plane. Furthermore, the abovementioned embodiments cited an example of a case wherein the interferometer unit 37 comprises a Fizeau type interferometer, but another interferometer can be provided, such as a Twyman-Green interferometer.

In addition, the first through fifth embodiments discussed above provide a local liquid space in the vicinity of the tip of the projection optical system, which is the object to be in however, as a method of supplying the liquid, a circumferential wall may be provided on the stage 9 and a prescribed amount of the liquid stored therein, and the flat surface part 8*a* of the folding glass member 8 according to the first and second embodiments, or the reflecting spherical surface part according to the third and fourth embodiments, may be disposed in the liquid on the inner side of that circumferential wall; alternatively, the stage 9 itself may be disposed in the liquid. In addition, an operator may manually supply and recover the liquid w without mounting the liquid supply apparatus, the liquid recovery apparatus, and the like.

In addition, the first through fifth embodiments discussed above described the inspection apparatus and the method of inspecting a liquid immersion projection optical system PL, but the inspection apparatus disclosed in the first through fifth embodiment can also be applied to the inspection of a projection optical system that does not use liquid. In addition, the system that inspects the optical performance of the liquid immersion projection optical system is not limited to the method wherein the measuring beam makes a round trip through the projection optical system as in the first through fifth embodiment discussed above, and a liquid supply mechanism may be provided to an inspection apparatus wherein the measuring beam passes through the projection optical system just one time, as disclosed in Japanese Unexamined Patent Application, First Publication No. 2000-97616.

Sixth Embodiment

The following explains the inspection apparatus according to the sixth embodiment of the present invention. The inspection apparatus according to the first through fifth embodiments discussed above is a stand-alone apparatus that measures the optical performance of the projection optical system PL, which is the object to be inspected. The inspection according to the sixth embodiment of the present invention explained below is provided with an exposure apparatus. Furthermore, the exposure apparatus of the present embodiment can use a liquid immersion exposure apparatus as disclosed in, for example, International Publication WO99/49504. In addition, the exposure appall of the present embodiment is constituted so that an inspection apparatus 80, as disclosed in Japanese Unexamined Patent Application, First Publication No. 2000-97616, is detachably attached to a wafer stage that holds the wafer.

Furthermore, the inspection apparatuses disclosed in International Publication WO99/60 (corresponding U.S. patent application Ser. No. 09/714,183), Japanese Unexamined Patent Application, First Publication No. 2002-71514, U.S. Pat. No. 6,650,399, and the like, are also applicable as the inspection apparatus 80. The disclosures of the above priority applications are hereby incorporated by reference in their entireties to the extent permitted by the laws and regulations of the states designed or elected by the present international patent application.

Figure 10:
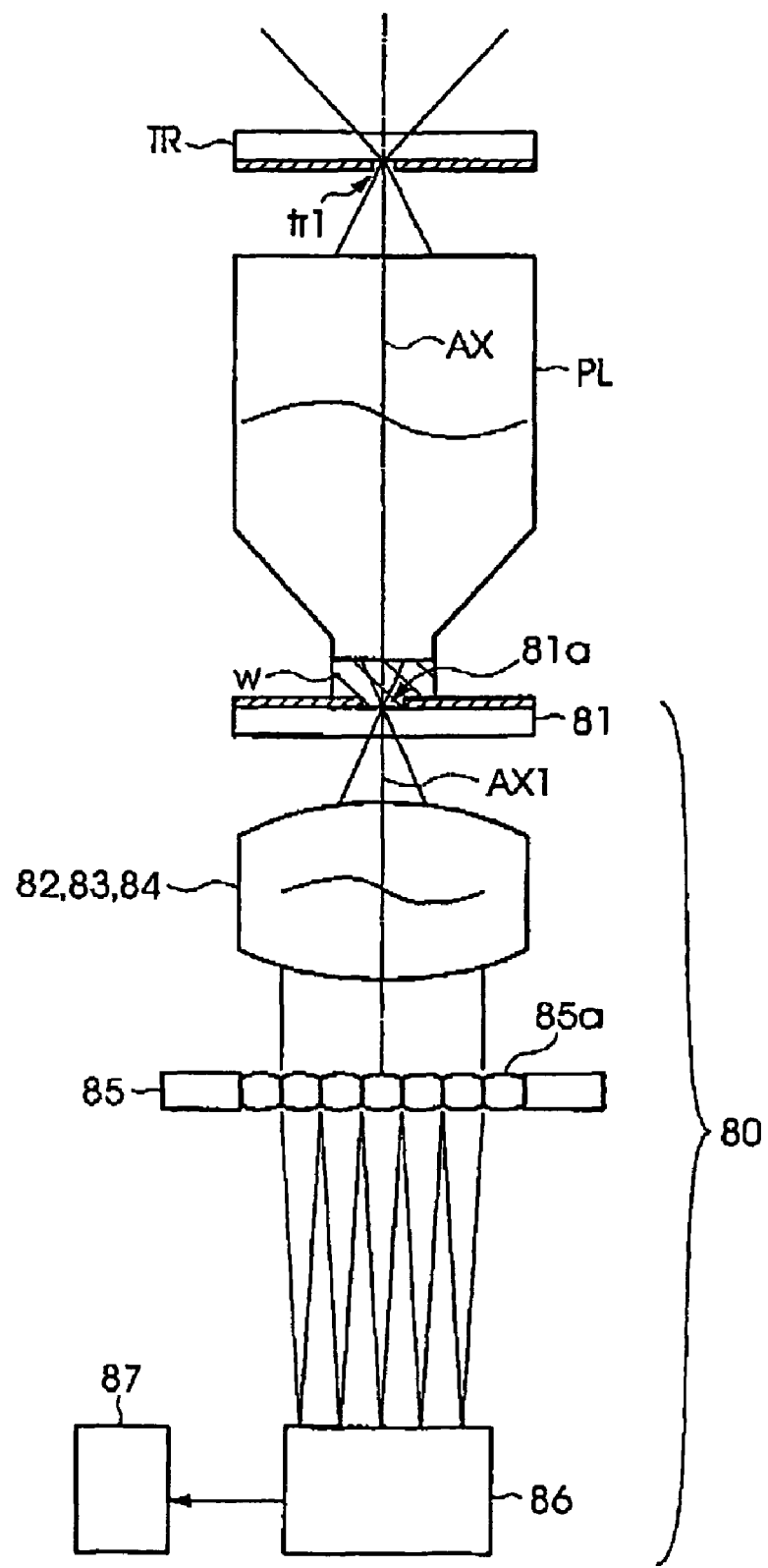
FIG. 10 is a schematic view of the principal components of the inspection apparatus.

FIG. 10 is a such schematic view of the principal component of one example of the inspection apparatus 80. FIG. 10 depicts the state wherein the inspection apparatus 80 is developed along its optical axis AX1. When inspecting the projection optical system PL using the inspection apparatus 80 of the present embodiment, a test reticle TR is loaded on the object plane side of the projection optical system PL. A plurality of circular, micro aperture parts tr1 are formed so that they are arrayed two dimensionally, for example, in the plane of the test reticle TR.

The inspection apparatus 80 of the present embodiment comprises a mark plate 81 attached at a height position (position in the Z axial direction) substantially the same as the surface of the wafer on the wafer stage. The mark plate 81 is made of, for example, a glass substrate, whose surface is disposed so that it is perpendicular to the optical axis AX of the projection optical system PL and perpendicular to the optical axis AX1 of the inspection apparatus 80. An aperture 81*a* is formed at the center part of the upper surface of the mark plate 81 and is set larger than the image of the aperture part tr1 of the test reticle TR that passes through and is projected by the projection optical system PL. The front side focal position of a collimator lens 82 is the of the aperture part 81a, and is set substantially the same as the surface position of the mark plate 81. In addition, the mark plate 81 has an area larger than the surface of the tip of the projection optical system PL, and of an extent that can locally hold the liquid between the projection optical system PL, and the mark plate 81.

As depicted in FIG. 10, the image of the aperture part tr1 of the test reticle TR passes through the aperture part 81a, which is formed in the mark plate 81 disposed in the image plane of the projection optical system PL, passes through the collimator lens 82 and the relay lenses 83 and 84, in that order, and enters a micro fly-eye 85. The micro fly-eye 85 is an optical element comprising numerous square shaped micro lenses 85a with positive relative power and densely arrayed vertically and horizontally. Accordingly, a light beam that enters the micro fly-eye 85 is divided two dimensionally by the numerous micro lenses 85a, and the images of the aperture pats tr1 formed in the test reticle TR are formed respectively in the vicinity of the rear side focal plane of each micro lens 85a. In other words, numerous images of aperture parts tr1 are formed in the vicinity of the rear side focal plane of the micro fly-eye 85. Thus, the numerous formed images are detected by a CCD 86, which serves as the photoelectric detector. The output of the CCD 86 is supplied to a signal processing unit 87, and the optical characteristics of the projection optical system PL are computed, particularly the wavefront aberration and each component of the wavefront aberration. The inspection apparatus 80 having the above constitution can hold the liquid w between the projection optical system PL and the mark plate 81, and can accurately inspect (measure) the optical performance of the liquid immersion projection optical system PL.

Furthermore, the following outlines the fabrication process of the projection optical system PL. Namely, the projection optical system PL is designed based on the wavelength of the light that passes through the projection optical system PL, the required resolution, and the like. Next, the optical elements (e.g., the lenses and diffraction gratings) provided in the designed projection optical system PL are manufactured and embedded in the lens barrel of the projection optical system PL, and the projection optical system PL is assembled. When the assembly of the projection optical system PL is completed, inspection is performed using the inspection apparatus depicted in the previously discussed first through fifth embodiments to determine whether the assembled projection optical system PL has the required optical performance. If the required optical performance is not obtained, the position of the optical elements provided inside the projection optical system PL are finely adjusted, and inspection is performed once again. The fine adjustment and the inspection are performed repetitively, and the optical performance of the projection optical system PL is adjusted so that it reaches the desired optical performance.

The above explained the embodiments of the present invention, but the specific constitution is not limited to these embodiments, and it is understood that variations and modifications may be effected without departing form the spirit and scope of the invention. For example, in the abovementioned embodiments, an explanation is given citing as an example the case wherein the light source 1 or the light source 50 is an ArF excimer laser light source; however, instead of an ArF excimer laser light source, it is also possible to use; an ultrahigh pressure mercury vapor lamp that emits, for example, the g-line (436 nm wavelength) and the i-line (365 nm wavelength); a KrF excimer laser (248 nm wavelength); an $F_2$ laser (157 nm wavelength); a $KR_2$ laser (146 nm wavelength); a YAG laser high frequency generation apparatus; or a semiconductor laser high frequency generation apparatus.

Furthermore, higher harmonics may also be used by amplifying a single wavelength laser light in the infrared region or the visible region oscillated from, for example, a DFB semiconductor laser or a fiber laser as the light source using an erbium (or both erbium and ytterbium) doped fiber amplifier, and then converting the wavelength to ultraviolet light using a nonlinear optical crystal. For example, if the oscillating wavelength of the single wavelength laser is set in the range of 1.51 to 1.59 μm, then the eighth harmonic, wherein the generating wavelength is in the range of 189 to 199 nm, is outputted, or the tenth harmonic, wherein the generating wavelength is in the range of 151 to 159 nm, is outputted.

In particular, if the oscillating wavelength is set within the range of 1.544 to 1.553 μm, then the eighth harmonic is obtained with a wavelength generated within the range of 193 to 194 nm, i.e., ultraviolet light with a wavelength substantially the same as ArF excimer laser light; and if the oscillating wavelength is set in the range of 1.57 to 1.58 μm, then the tenth harmonic is obtained with a wavelength generated in the range of 157 to 158 nm, i.e., ultraviolet light with a wavelength substantially the same as $F_2$ laser light. In addition, if the oscillating wavelength is set in the range of 1.03 to 1.12 μm, then the seventh harmonic is output with a wavelength generated in the range of 147 to 160 nm, and particularly if the oscillating wavelength is set in the range of 1.099 to 1.106 μm, then the seventh harmonic is obtained with a wavelength generated in the range of 157 to 158 μm, i.e., ultraviolet light whose wavelength is substantially the same as $F_2$ laser light. In this case, an ytterbium doped fiber laser, for example, can be used as the single wavelength oscillating laser.

In addition, the abovementioned embodiments were explained citing as an example a case wherein synthetic quartz or fluorite (calcium fluoride $CaF_2$) was used as the glass material for the optical elements L1-L3, and the like, provided to the projection optical system PL; the folding glass members 8 and 32; and the lens 21, the collimator lens 22, the reference lens 27, the relay lenses 28 and 29, and the like, provided to the interferometer unit 2. Nevertheless, in accordance with the wavelengths of the light beam emitted from the light sources 1 and 50, the glass material is selected form the group consisting of optical materials that transmit vacuum ultraviolet light, such as: fluoride crystals, such as fluorite (calcium fluoride, $CaF_2$), magnesium fluoride ($MgF_2$), lithium fluoride (LiF), barium fluoride ($BaF_2$), strontium fluoride ($SrF_2$), LiCAF (colquiriite, $LiCaAlF_6$), LiSAF (LiSrAlF_6), $LiMgAlF_6$, $LiBeAlF_6$, $KMgF_3$, $KCaF_3$, $KSrF_3$, and the crystals thereof, and quartz glass doped with a substance, such as fluorine and hydrogen. Furthermore, if the wavelength of the exposure light falls below approximately 150 nm, then the transmittance of quartz glass doped with a prescribed substance decreases; consequently, if vacuum ultraviolet light whose wavelength is less than approximately 150 nm is used as the exposure light, then a fluoride crystal, such as fluorite (calcium fluoride), magnesium fluoride, lithium fluoride, barium fluoride, strontium fluoride, LiCAF (colquiriite), LiSAF ($LiSrAlF_6$), $LiMgAlF_6$, $LiBeAlF_6$, $KMgF_3$, $KCaF_3$, $KSrF_3$, or any combination of crystals thereof, is used as the optical material of the optical element.

Furthermore, if using, for example, a $F_2$ laser as the exposure light, because pure water does not transmit $F_2$ laser light, it is preferable to use a fluorine based liquid, such as perfluorinated polyether, as the liquid.

The above explained the preferred embodiments of the present invention, but the present invention is not limited to these embodiments. Additions, omissions, substitutions, and other modifications may be effected without departing from the spirit and scope of the invention. The present invention is limited only by the scope of the appended claims, and is not limited by the explanation discussed above.

The present invention relates to a projection optical system inspecting method that inspects the optical performance of a projection optical system used for immersion exposure, wherein a liquid is supplied to the image plane side of the projection optical system; and a measuring beam that passes through the projection optical system and the liquid is photoelectrically detected.

The present invention relates to a projection optical system inspection apparatus that inspects the optical performance of the projection optical system used for immersion exposure, comprising: a reflecting spherical surface part disposed on the image plane side of the projection optical system, and a photoelectric detector that photoelectrically detects the measuring beam that entered the projection optical system, transmitted through the liquid supplied to at least one part between the projection optical system and the reflecting spherical surface part, and was reflected by the reflecting spherical part.

The present invention relates to a projection optical system inspection apparatus that inspects the optical performance of a projection optical system, comprising: a plurality of reflecting spherical surface parts dispose on the image plane side of the projection optical system; and a photoelectric detector that photoelectrically detects the measuring beam reflected by the plurality of reflecting spherical surface parts.

The present invention relates to a projection optical system inspection apparatus that inspects the optical performance of a projection optical system used for immersion exposure, comprising: a flat part disposed on the image plane side of the projection optical system; and a photoelectric detector that photoelectrically detects the measuring beam that passes through the liquid, which is disposed between the projection optical system and the flat part, and the projection optical system.

According to the present invention, the optical performance of an immersion projection optical system can be accurately inspected because, when inspecting the optical performance of the projection optical system, which is the object to be inspected, the measuring beam is photoelectrically detected via a projection optical system disposed on the image plane side of the projection optical system. In addition, because the inspection is performed in a state wherein liquid is filled between the projection optical system and the flat part of the optical member, or between the projection optical system and the flat surface part and the reflecting spherical surface part, the wavefront of the measuring beam is not disturbed by the convection of the liquid, the liquid absorbs little of the measuring beam, and the optical performance of a liquid immersion type projection optical system can be accurately inspected.

What is claimed is:

1. A projection optical system inspecting method that inspects the optical performance of a projection optical system used for immersion exposure, the method comprising:
   providing an optical member in an image plane side of the projection optical system, an area of the optical member being larger than a surface of a tip of the projection optical system;
   providing a detector;
   supplying a liquid to the image plane side of the projection optical system;
   photoelectrically detecting a measuring beam that passes through the projection optical system, the liquid and the optical; and
   two dimensionally dividing the measuring beam that passes through the optical member.

2. A projection optical system inspecting method according to claim 1, wherein
   the optical member includes a flat part which is disposed on the image plane side of the projection optical system; and
   the liquid is supplied between the projection optical system and the flat part.

3. A projection optical system inspection apparatus that inspects the optical performance of a projection optical system used for immersion exposure, the projection optical system inspection apparatus comprising:
   a flat part disposed on an image plane side of the projection optical system, an area of the flat part being larger than a surface of a tip of the projection optical system; and
   a photoelectric detector that photoelectrically detects a measuring beam, the measuring beam passing through in order of the projection optical system, a liquid disposed between the projection optical system and the flat part, and the flat part, wherein the measuring beam that passes through the flat part is two dimensionally divided.

4. A projection optical system inspection apparatus according to claim 3, wherein
   the wavefront aberration of the projection optical system is measured.

5. A projection optical system inspecting method according to claim 2, wherein the photoelectrically detecting comprises photoelectrically detecting the measuring beam that passes through the projection optical system, the liquid, and the flat part.

6. A projection optical system inspection apparatus according to claim 3, further comprising an optical system which is disposed between the flat part and the photoelectric detector.

7. A projection optical system inspection apparatus according to claim 6, further comprising a beam dividing element which is disposed between the optical system and the photoelectric detector.

8. A projection optical system inspection apparatus according to claim 7, wherein the beam dividing element is disposed in a rear focal plane.

9. A projection optical system inspection apparatus according to claim 7, wherein the beam dividing element divides a beam that enters the dividing element into two dimensions.

10. An exposure apparatus comprising:
    a projection optical system; and
    the projection optical system inspection apparatus according to claim 3.

11. An exposure apparatus according to claim 10, further comprising a stage including the projection optical system inspection apparatus.

12. An exposure apparatus according to claim 10, further comprising a wafer stage which holds a wafer,
    wherein the flat part is disposed at a height position substantially the same as a surface of the wafer held on the wafer stage.

13. A projection optical system inspection apparatus according to claim 3, wherein the wavefront aberration of the projection optical system is measured.

14. An exposing method comprising:
    inspecting a projection optical system according to the inspecting method of claim 1;
    illuminating a pattern set on a first plane; and
    projecting and exposing an image of the pattern onto a photosensitive substrate via the projection optical system that has been inspected.

15. A device manufacturing method comprising:

inspecting a projection optical system according to the inspecting method of claim 1;

preparing a predetermined pattern;

transferring an image of the pattern onto a photosensitive substrate with the projection optical system that has been inspected; and developing the photosensitive substrate to which the image of the pattern has been transferred.

16. An exposure apparatus comprising:

the projection optical system inspection apparatus according to claim 3;

an illuminating system; and a projection optical system arranged between a first plane and a second plane and which forms an image of a pattern disposed on the first plane onto a photosensitive substrate disposed on the second plane based on radiation from the illuminating system.

* * * * *